(12) United States Patent
Mun et al.

(10) Patent No.: US 10,306,816 B2
(45) Date of Patent: May 28, 2019

(54) EMI SHIELDING STRUCTURE

(71) Applicant: SAMSUNG ELECTRONICS CO., LTD., Suwon-si, Gyeonggi-do (KR)

(72) Inventors: Il-ju Mun, Suwon-si (KR); Keon Kuk, Yongin-si (KR); Ji-woon Yeom, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/789,184

(22) Filed: Oct. 20, 2017

(65) Prior Publication Data

US 2018/0116078 A1    Apr. 26, 2018

Related U.S. Application Data

(60) Provisional application No. 62/411,008, filed on Oct. 21, 2016.

(30) Foreign Application Priority Data

Jan. 25, 2017    (KR) .......... 10-2017-0011671

(51) Int. Cl.
*H05K 7/10* (2006.01)
*H05K 7/12* (2006.01)
(Continued)

(52) U.S. Cl.
CPC ......... *H05K 9/0024* (2013.01); *H01L 23/552* (2013.01); *H05K 1/111* (2013.01); *H05K 1/117* (2013.01); *H05K 1/181* (2013.01); *H05K 9/0039* (2013.01); *H05K 3/284* (2013.01); *H05K 3/321* (2013.01); *H05K 3/4007* (2013.01); *H05K 2201/0919* (2013.01); *H05K 2201/10371* (2013.01); *H05K 2201/10522* (2013.01); *H05K 2201/10545* (2013.01); *H05K 2201/10734* (2013.01); *H05K 2203/0126* (2013.01); *H05K 2203/1316* (2013.01); *H05K 2203/1327* (2013.01); *H05K 2203/163* (2013.01)

(58) Field of Classification Search
CPC ...... H01L 23/552; H05K 1/111; H05K 1/181; H05K 2201/10371; H05K 2201/10522; H05K 2201/10545; H05K 2201/10734; H05K 2203/0126; H05K 2203/163; H05K 3/4007; H05K 9/0024
See application file for complete search history.

(56) References Cited

U.S. PATENT DOCUMENTS 6,958,445 B1    10/2005 Boudreaux et al.
8,958,855 B2    2/2015 Shin et al.
(Continued)

FOREIGN PATENT DOCUMENTS

KR    10-2010-0046594    5/2010
KR    10-2016-0108117    9/2016
(Continued)

*Primary Examiner* — Yuriy Semenenko
(74) *Attorney, Agent, or Firm* — Nixon & Vanderhye P.C.

(57) ABSTRACT

An EMI shielding structure includes a shielding pad surrounding at least one circuit component mounted on a printed circuit board and grounded to a ground pad disposed on the printed circuit board; and a shield can configured to cover the at least one circuit component, wherein a portion of the shield can is attached to the shielding pad.

14 Claims, 35 Drawing Sheets

(51) Int. Cl.
    *H05K 9/00*    (2006.01)
    *H05K 1/11*    (2006.01)
    *H05K 1/18*    (2006.01)
    *H01L 23/552*    (2006.01)
    *H05K 3/40*    (2006.01)
    *H05K 3/28*    (2006.01)
    *H05K 3/32*    (2006.01)

(56) References Cited

U.S. PATENT DOCUMENTS

| | | | |
|---|---|---|---|
| 9,018,542 B2 | 4/2015 | Kwon et al. | |
| 2005/0045358 A1* | 3/2005 | Arnold | H05K 9/0024 174/51 |
| 2010/0200983 A1* | 8/2010 | Ono | H01L 23/055 257/708 |
| 2010/0327431 A1* | 12/2010 | Touzelbaev | B23K 1/0016 257/712 |
| 2011/0292621 A1* | 12/2011 | Beaumier | H01L 23/055 361/748 |
| 2012/0126347 A1* | 5/2012 | Yang | B81B 7/0064 257/416 |
| 2013/0083501 A1* | 4/2013 | Azzopardi | B81C 1/00269 361/757 |
| 2016/0262292 A1 | 9/2016 | Kuk et al. | |
| 2016/0276288 A1 | 9/2016 | Lee et al. | |
| 2017/0295679 A1 | 10/2017 | Kim et al. | |
| 2017/0325365 A1 | 11/2017 | Kuk et al. | |
| 2018/0042147 A1 | 2/2018 | Mun et al. | |

FOREIGN PATENT DOCUMENTS

| | | |
|---|---|---|
| KR | 10-2016-0111262 | 9/2016 |
| KR | 10-1658821 | 9/2016 |
| KR | 10-2018-0067047 | 6/2018 |

\* cited by examiner

EMI SHIELDING STRUCTURE

CROSS-REFERENCE TO RELATED APPLICATIONS

This application is based on and claims priority under 35 U.S.C. § 119 to U.S. Provisional Application No. 62/411,008, filed Oct. 21, 2016 in the United States Patent & Trademark Office, and Korean Patent Application No. 10-2017-0011671 filed Jan. 25, 2017 in the Korean Intellectual Property Office, the disclosures of which are incorporated by reference herein in their entireties.

BACKGROUND

1. Field

The present disclosure relates generally to an electromagnetic interference (EMI) shielding structure, and for example, to an EMI shielding structure provided with an EMI shielding member capable of protecting semiconductor chips and various circuit components contained in a package from the external environment and shielding EMI.

2. Description of Related Art

Recently, in the electronic products market, demand for portable devices has been rapidly increasing, and there is a continuing demand for miniaturization and weight reduction of electronic components mounted on these products. In order to realize miniaturization and weight reduction of such electronic components, there is a demand for a technique for reducing the size of each of the mounting components and a semiconductor package technology for integrating a plurality of individual components into one package. In particular, semiconductor packages for handing high frequency signals are required to have various EMI shielding structures in order to realize excellent EMI interference or EMI immunity characteristics as well as miniaturization.

To this end, a conventional EMI shielding structure applied to a semiconductor package has a structure in which a pressed metal shield can covers various components.

In the manufacturing process of a printed circuit board of a mobile phone, a shield can is assembled after all components are mounted, and a reflow process in which a solder cream is melted and cooled again is required to bond the components and the shield can to the printed circuit board. Thereafter, additional processes are performed for various functions. A problem may occur when the additional process is performed at a high temperature. So the additional process proceeds after the reflow process.

However, for functional reasons, an additional process may have to be performed before attaching the shield can. In this case, there is a difficulty in performing the additional process due to the limitation of the process order and the process progressing at a high temperature.

For example, a thermal interface material (TIM) for heat generation control is applied on a component that generates heat. The heat interface material may achieve efficient heat transfer by eliminating the air gap between the two adjacent members and increasing the contact area. If the thermal interface material is subjected to a high temperature process while being coated on the component, the heat transfer function is not performed because the thermal interface material melts and flows down. Thus, the process of applying the thermal interface material onto the component necessarily proceeds after the reflow process. As a result, there was no way to apply the thermal interface material between the component and the shield can before the shield can was soldered to the printed circuit board.

In addition, due to a problem of a component mounted on a printed circuit board or a functional problem, when a rework in which the soldered component is removed from the printed circuit board and is replaced with a normal component is performed, the shield can that is soldered to the printed circuit board must be removed first. However, because the shield can is soldered to the printed circuit board, hot air is blown to dissolve the solder, and the shield can is separated from the printed circuit board. Since the solders of small components mounted on the printed circuit board are melted together by the hot air, the components may be separated from the printed circuit board or the preset positions of the components may be changed.

SUMMARY

The present disclosure addresses the above drawbacks and other problems associated with the conventional arrangement. An example aspect of the present disclosure relates to an EMI shielding structure which uses a shield can that is attached to a printed circuit board with a shielding material without soldering.

According to an example aspect of the present disclosure, an EMI shielding structure may include a shielding pad surrounding at least one circuit component mounted on a printed circuit board and grounded to a ground pad formed on the printed circuit board; and a shield can configured to cover the at least one circuit component, wherein a portion of the shield can is attached to the shielding pad.

A lower end portion of a side wall of the shield can may be embedded in an upper portion of the shielding pad. The lower end portion of the side wall of the shield can may be bent.

A width of the shielding pad may be greater than a width of the lower end portion of the side wall of the shield can.

The EMI shielding structure may include a shielding member covering a side wall of the shield can and an upper portion of the shielding pad.

The shielding pad may cover the entire side wall of the shield can and an edge portion of a top surface of the shield can.

The EMI shielding structure may include an insulator covering a side wall of the shield can and an upper portion of the shielding pad.

The insulator may cover a portion of a top surface of the printed circuit board. The lower end portion of the shield can may be provided with at least one groove.

The ground pad may be formed on a top surface of the printed circuit board, and the shielding pad may be formed on the top surface of the printed circuit board and cover the ground pad.

The ground pad may be formed on a side surface of the printed circuit board, and the shielding pad may be formed on an end portion of the printed circuit board.

The shielding pad may include a first portion formed on the side surface of the printed circuit board and covering the ground pad; and a second portion formed on an edge portion of a top surface of the printed circuit board. The ground pad may include a plurality of spaced apart ground pads.

According to another example aspect of the present disclosure, an EMI shielding structure may include a shielding dam surrounding at least one circuit component mounted on a printed circuit board and grounded to a ground pad formed on the printed circuit board; and a shield can configured to cover the at least one circuit component, wherein a portion of the shield can is embedded in the shielding dam. The lower end portion of the side wall of the shield can may be bent.

BRIEF DESCRIPTION OF THE DRAWINGS

The above and/or other aspects, features and attendant advantages of the present disclosure will become apparent and more readily appreciated from the following detailed description, taken in conjunction with the accompanying drawings, in which like reference numerals refer to like elements, and wherein.

DETAILED DESCRIPTION

Figure 1:
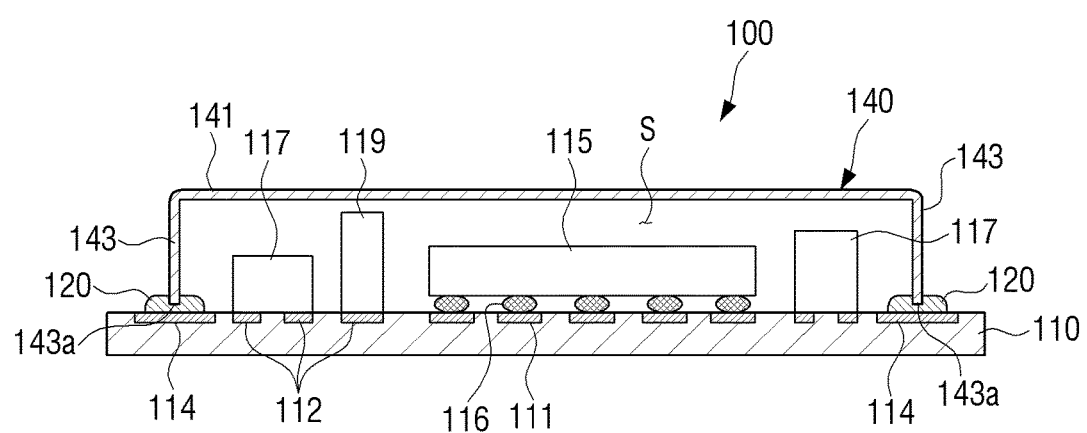
FIG. 1 is a cross-sectional view illustrating an example EMI shielding structure according to an example embodiment of the present disclosure.

Various example embodiments of the present disclosure will now be described in greater detail with reference to the accompanying drawings.

In the following description, same drawing reference numerals are used for the same elements even in different drawings. The matters defined in the disclosure, such as detailed construction and elements, are provided to assist in a comprehensive understanding of the present disclosure. Accordingly, it is apparent that the various example embodiments of the present disclosure can be carried out without those specifically defined matters. Also, well-known functions or constructions may not be described in detail where they would obscure the disclosure with unnecessary detail. Further, dimensions of various elements in the accompanying drawings may be arbitrarily increased or decreased for assisting in a comprehensive understanding.

When an element is stated as being "on" or "in contact with" another element, it is to be understood that the element may be directly contacted or connected with another element, but may also include yet another element disposed therebetween. Meanwhile, when one element is stated as being "immediately on" or "directly contacted with" another element, it may be understood that there may be no other element present interposed therebetween. Other expressions for explaining relations between elements, e.g., "between," "directly between," and so on may be understood in a similar manner.

The terms, "first," "second," and so on may be used in explaining various elements, but the elements should not be limited with such terms. The terms may be used for a purpose of distinguishing one element from another element. For example, a first element may be named a second element without departing from the scope of the present disclosure, and similarly, a second element may be named a first element.

A singular expression includes a plural expression unless specifically expressed otherwise in the context. Terms such as "comprise" or "have" are used to designate presence of characteristics, numbers, processes, operations, elements, components or a combination thereof described herein, and it is to be understood that one or more another characteristics, numbers, processes, operations, elements, components or a combination thereof may be added.

Unless otherwise defined in the example embodiments of the present disclosure, terms may be construed as having a meaning generally known to a person skilled in the art.

An EMI shielding structure according to various example embodiments of the present disclosure may be applied, for example, and without limitation, to a smartphone, a display device, a wearable device, or the like. Further, although the EMI shielding structure according to various example embodiments of the present disclosure is described as shielding a plurality of circuit elements, the present disclosure is not limited thereto. The EMI shielding structure according to an example embodiment of the present disclosure may be formed to cover shield only a single circuit element.

Hereinafter, an EMI shielding structure according to various example embodiments of the present disclosure will be described in greater detail with reference to the accompanying drawings.

FIG. 1 is a cross-sectional view illustrating an EMI shielding structure according to an example embodiment of the present disclosure.

Referring to FIG. 1, an EMI shielding structure 100 may include a printed circuit board 110 and a plurality of circuit components 115, 117, and 119 mounted on the printed circuit board 110. Here, the plurality of circuit components may, for example, and without limitation, be different types of circuit components such as an integrated circuit (IC) chip, a passive component, and a different shape component, or the like. For example, and without limitation, the IC chip may include an application processor (AP), a memory, a radio frequency (RF) chip, or the like, the passive component may include a resistor, a capacitor, a coil, or the like, and the different shape component may include, for example, and without limitation, a connector, a card socket, an EMI shielding component, or the like.

The printed circuit board 110 may be provided with a ground pad 114 formed, for example, by patterning. The ground pad 114 may be formed on the printed circuit board 110 with the top surface of the ground pad 114 exposed without protruding from the top surface of the printed circuit board 110. In this case, the ground pad 114 may be formed integrally with a ground layer (not illustrated) formed inside the printed circuit board 110.

The ground pad 114 may be patterned to correspond to an outermost portion of the structure for shielding. In this case, the ground pad 114 may be formed in a solid line shape or a hidden line shape. The ground terminals of the plurality of circuit components 115, 117, and 119 may be grounded to the ground pad 114.

The circuit component 115 may include a plurality of connection terminals 116 electrically connected to a first connection pad 111 of the printed circuit board 110. The plurality of connection terminals 116 may, for example, be formed by a ball grid array (BGA) manner such as a solder ball. However, the connection terminals 116 are not limited to the BGA type and may be formed in various manners depending on the lead shape of the circuit component 115. For example, the connection terminals 116 may be formed in various manners such as a quad flat no lead (QFN), a plastic leaded chip carrier (PLCC), a quad flat package (QFP), a small out line package (SOP), a thin small out line package (TSOP), a shrink small out line package (SSOP), a thin shrink small out line package (TSSOP), or the like but are not limited thereto.

The other connection components 117 and 119 may include at least one connection terminal (not illustrated) electrically connected to a second connection pad 112 of the printed circuit board 110. When the circuit components 117 and 118 are mounted on the printed circuit board 110, the height of each of the circuit components 117 and 118 may be lower or higher than the circuit component 115 described above. The interval between the circuit components 115, 117, and 119 may be narrowly designed to be, for example, and without limitation, 0.8 mm or less.

Referring to FIG. 1, the EMI shielding structure 100 according to an example embodiment of the present disclosure may include a shielding pad 120 formed on the ground pad 114 and a shield can 140 covering the plurality of circuit components 115, 117, and 119.

The shielding pad 120 may be formed on and along the ground pad 114. Accordingly, when the pattern of the ground pad 114 is in the form of a closed curve, the pattern of the shielding pad 120 may also be in the form of a closed curve. However, the pattern of the shielding pad 120 may not match the pattern of the ground pad 114. In other words, the shielding pad 120 may be formed to correspond to only a portion of the pattern of the ground pad 114.

The shielding pad 120 may be formed to have a predetermined thickness such that a lower end 143a of a sidewall 143 of the shield can 140 may be embedded in the shielding pad 120 without touching the ground pad 114. In this case, the lower end 143a of the shield can 140 may be grounded to the ground pad 114 via the shielding pad 120.

Figure 5:
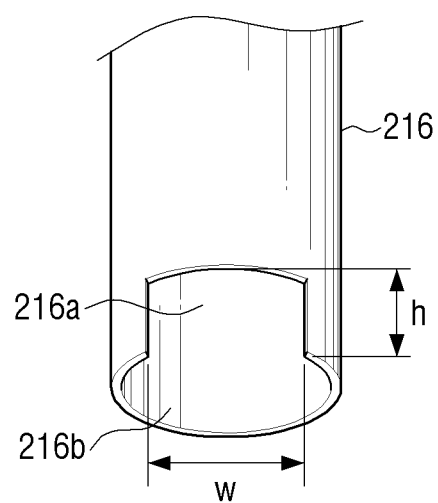
FIG. 5 is an enlarged perspective view illustrating an end portion of the nozzle illustrated in FIG. 3.

The shielding pad 120 may, for example, and without limitation, be made of an electroconductive material having a predetermined viscosity that can be discharged from a nozzle 216 (see, e.g., FIG. 5). Such an electroconductive material may include an electroconductive filler and a binder resin or the like.

As the electroconductive filler, metal such as Ag, Cu, Ni, Al, Sn, or the like; conductive carbon such as carbon black, carbon nanotube (CNT), graphite, or the like; metal coated materials such as Ag/Cu, Ag/glass fiber, Ni/graphite, or the like; or conductive high molecular materials such as polypyrrole, polyaniline, or the like may be used, but is not limited thereto. In addition, the electroconductive filler may be formed of any one of a flake type, a sphere type, a rod type, and a dendritic type or a mixture thereof, or the like, but is not limited thereto.

As the binder resin, a silicon resin, an epoxy resin, a urethane resin, an alkyd resin, or the like may be used, but is not limited thereto. The material of the shielding pad 120 may further contain additives for improving other performance (a thickener, an antioxidant, a polymer surfactant, etc.), a solvent (water, alcohol, etc.), or the like, without limitation.

When the fluidity of the shielding material is too large, the shielding material may have a problem of moving to a position deviating from the ground pad 114. Therefore, the viscosity of the shielding material may, for example, and without limitation, be about 1,000 cps to 100,000 cps.

The shield can 140 may, for example, include of a conductive metal and may have an area corresponding to the shielded region so as to cover the entire shielded region. The shield can 140 may comprise a conductive metal, for example, and without limitation, stainless steel as it is, or stainless steel whose surface is subjected to a special treatment in order to improve adhesion with the shielding pad 120, or the like.

Since the shield can 140 is formed in a plate-like shape having a predetermined thickness, the shield can 140 may have rigidity, thereby ensuring structural stability. The shield can 140 may include a top plate 141 and side walls 143 that are bent downward along the rim of the top plate 141. The top plate 141 is substantially flat and covers the top of the shielded region. At least one air vent hole (not illustrated) may be formed in the top plate 141 so that thermally expanded air may be discharged from an insulating space S formed between the top plate 141 and the printed circuit board 110.

The shield can 140 may be provided with a hole for other purposes besides air discharge. In other words, a hole having a predetermined area (not illustrated) may be formed in a portion of the top plate 141 of the shield can 140 corresponding to the position of a circuit component (for example, an oscillator) to prevent and/or reduce unnecessary capacitance occurring between the circuit component and the shield can 140 from changing the frequency characteristics. In addition, when the height of the circuit component used in the shielded region is higher than the height of the top plate 141 of the shield can 140, a hole (not illustrated) may be formed so that the circuit component does not interfere with the top plate 141 of the shield can 140.

The lower ends 143a of the side walls 143 of the shield can 140 are seated on the upper portion of the shielding pad 120. At this time, since the lower end 143a of the side wall 143 is seated on the upper portion of the shielding pad 120 before the shielding pad 120 is hardened, the lower end 143a of the side wall 143 may be inserted into the shielding pad 120. When the shielding pad 120 is cured in a state where the lower end 143a of the side wall 143 is embedded in the shielding pad 120, the shield can 140 may be stably fixed to the shielding pad 120.

In the case where a process of applying a thermally conductive material (not illustrated) to a heating element is applied to a process of manufacturing the EMI shielding structure, the shield can 140 may be fixed to the shielding pad 120 after the thermally conductive material is applied to the heating element. The shielding pad 120 may include an electroconductive material that can be cured at room temperature or at such a heating temperature that the thermally conductive material does not dissolve. As the thermally conductive material applied on the upper portion of the heating element is in close contact with the bottom surface of the top plate 141 of the shield can 140, heat generated in the heating element may be dispersed throughout the shield can 140 to cool the heating element. When a heat pipe (not illustrated) is placed on the top surface of the top plate 141 of the shield can 140, the heat transmitted to the shield can 140 may be dispersed into a frame of an electronic device (not illustrated) through the heat pipe, thereby improving the cooling effect.

In addition, in the EMI shielding structure 100 according to an example embodiment of the present disclosure, since the shield can 140 is fixed to the shielding pad 120 having a predetermined elasticity, the shielding pad 120 may be easily removed from the printed circuit board 110 by, for example, using a paddle-shaped tool without applying hot air during rework. The shield can 140 is detached from the printed circuit board 110 together with the shielding pad 120. Accordingly, since the conventional process for applying the hot air is omitted when separating the shield can 140 from the printed circuit board 110, the problem that the solder of the small components mounted on the printed circuit board 110 are melted by the hot air so that the small components are separated from the printed circuit board 110 or the predetermined positions of the small components are changed may be reduced.

Hereinafter, the process of manufacturing the EMI shielding structure 100 according to an embodiment of the present disclosure will be sequentially described with reference to FIG. 2. FIGS. 2A, 2B and 2C are cross-sectional views illustrating an example manufacturing process of an EMI shielding structure according to an example embodiment of the present disclosure, and FIG. 3 is a diagram illustrating an example of forming a shielding pad on a ground pattern through a shielding material discharged from a nozzle according to an example embodiment of the present disclosure.

Figure 2A:
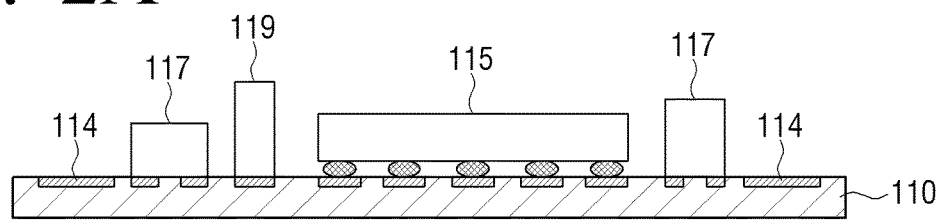
FIGS. 2A, 2B and 2C are cross-sectional views illustrating an example manufacturing process of an EMI shielding structure according to an example embodiment of the present disclosure.

First, as illustrated in FIG. 2A, the printed circuit board 110 on which the plurality of circuit components 115, 117, and 119 are mounted is disposed at a working position. In this case, the ground pad 114, which can correspond to the outline of the shielded region, is previously patterned on the printed circuit board 110.

Figure 2B:
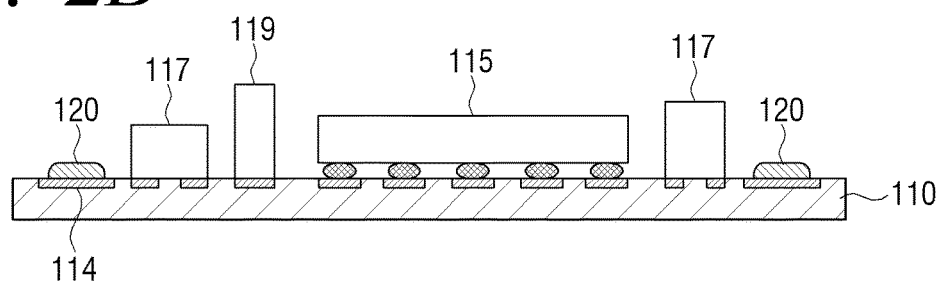
Figure 3:
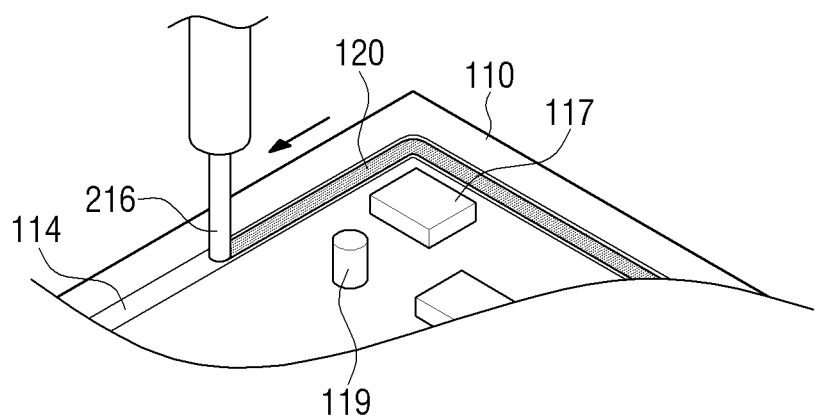
FIG. 3 is a diagram illustrating an example of forming a shielding pad on a ground pattern through a shielding material discharged from a nozzle according to an example embodiment of the present disclosure.

As illustrated in FIGS. 2B and 3, a nozzle 216 described later discharges the shielding material while moving along a predetermined path. The shielding material may become the shielding pad 120 with a predetermined thickness formed along the ground pad 114.

Figure 2C:
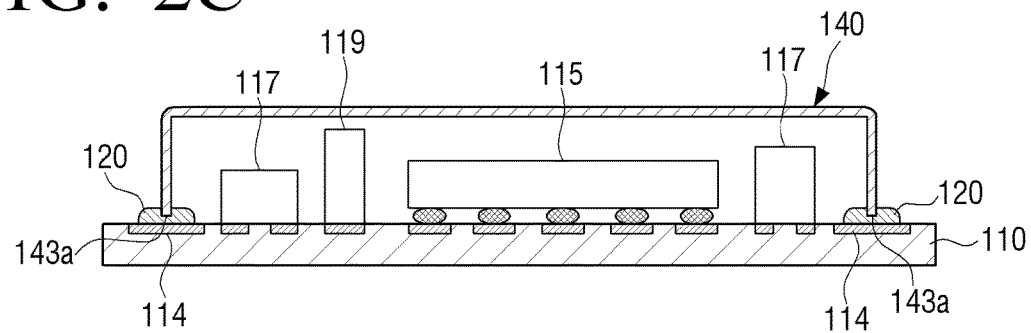

After the shielding pad 120 is formed, the shield can 140 may be attached to the printed circuit board 110 by a robot arm as illustrated in FIG. 2C. In this case, the lower end 143a of the side wall 143 of the shield can 140 may be seated on the upper portion of the shielding pad 120, and then, inserted into the shielding pad 120 by a predetermined pressure applied toward the printed circuit board 110. At this time, the lower end 143a of the side wall 143 may be embedded in the shielding pad 120 and spaced apart from the ground pad 114 by a predetermined distance. However, the lower end 143a of the side wall 143 may be inserted into the shielding pad 120 to the extent that the lower end 143a is in contact with the ground pad 114 without being limited thereto.

Hereinafter, a material dispensing apparatus and method for forming a shielding pad of an EMI shielding structure 100 according to an example embodiment of the present disclosure will be described in greater detail below with reference to FIGS. 4 to 6.

Figure 4:
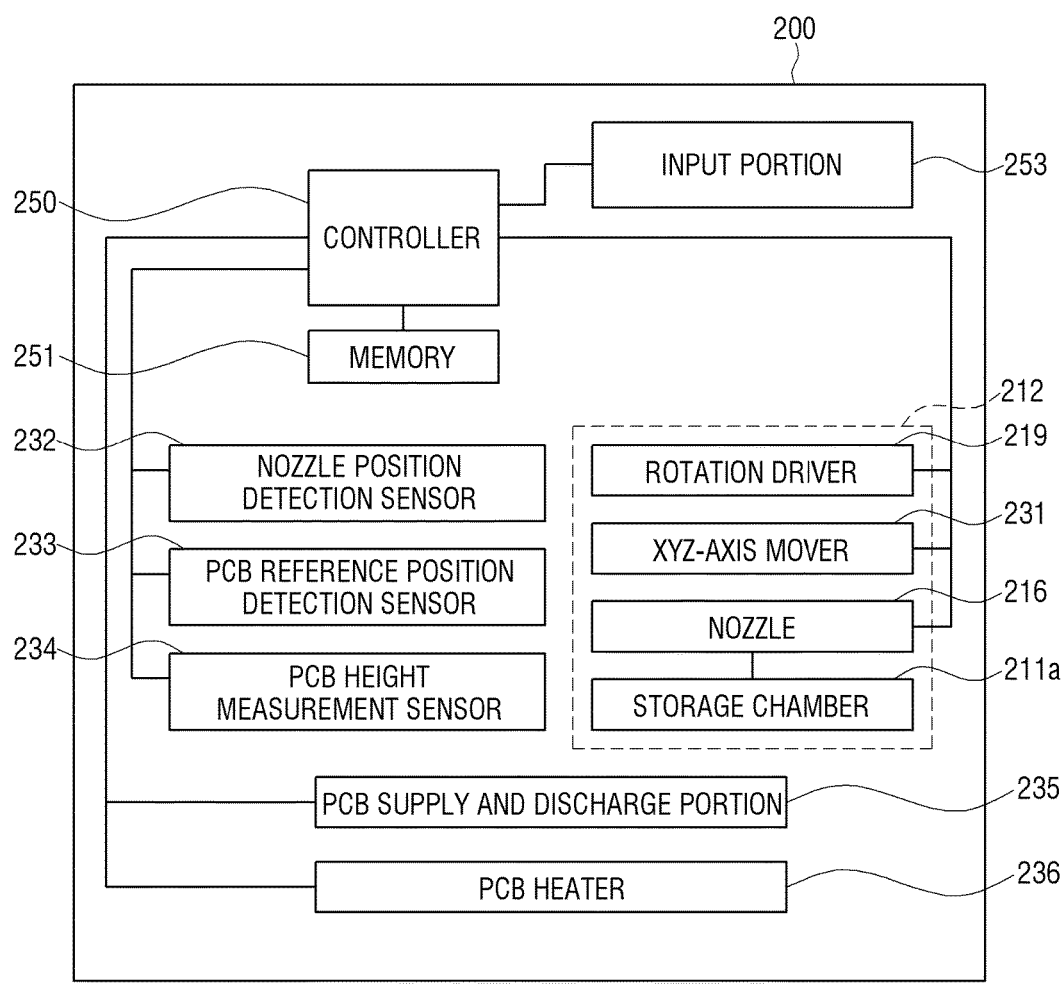
FIG. 4 is a block diagram illustrating an example material dispensing apparatus for forming a shielding pad according to an example embodiment of the present disclosure.

FIG. 4 is a block diagram illustrating an example material dispensing apparatus for forming a shielding pad according to an example embodiment of the present disclosure. FIG. 5 is an enlarged perspective view illustrating an end portion of the nozzle according to an example embodiment of the present disclosure. FIG. 6 is a diagram illustrating an example of a path through which a nozzle of a material dispensing apparatus moves according to an example embodiment of the present disclosure.

A material dispensing apparatus 200 may include a dispenser 212 to discharge a predetermined amount of insulating material. The dispenser 212 may include a storage chamber 211a for storing the insulating material and a nozzle 216 for discharging the material supplied from the storage chamber 211a.

The dispenser 212 may include an XYZ-axis mover 231 that moves the nozzle 216 in the X-axis, Y-axis, and Z-axis directions, and a rotation driver 219 that rotates the nozzle 216 in the clockwise and counter-clockwise directions or stops the rotation of the nozzle 216. The XYZ-axis mover 231 may include a plurality of step motors (not illustrated) for moving the nozzle 216 in the X-axis, Y-axis, and Z-axis, respectively. The step motors are connected to a nozzle mounting portion (not illustrated) in which the nozzle 216 is mounted to transmit the driving force to the nozzle 216. The rotation driver 219 may include a motor (not illustrated) that provides rotational power and an encoder (not illustrated) that senses the number of revolutions of the motor in order to control the rotation angle of the nozzle 216. The XYZ-axis mover 231 and the rotation driver 219 are electrically connected to a controller 250 and are controlled by the controller 250.

When the discharge port of the nozzle 216 is cleaned or the nozzle 216 is replaced with a new nozzle, the material dispensing apparatus 200 often fails to accurately match the end of the nozzle 216 from which the material is discharged to a preset setting position. Therefore, a nozzle position detection sensor 232 is provided to set the nozzle 216 to the setting position.

A vision camera may be used as the nozzle position detection sensor 232, and the nozzle position detection sensor 232 is disposed below the nozzle 216 at a predetermined interval. The calibration of the nozzle 216 may be performed by reading a position of the end of the nozzle 216 through an image captured by the nozzle position detection sensor 232, comparing the position of the end of the nozzle 216 with a nozzle origin value stored in advance in a memory 251 to obtain X and Y values that are different from the nozzle origin value, and moving the nozzle 216 by the X and Y values to match the end of the nozzle 216 with the nozzle origin. In this case, the movement of the nozzle 216 is achieved by moving the nozzle mounting portion (not illustrated) by driving of the XYZ-axis mover 231.

In addition, when the printed circuit board 110 is loaded in the position for forming the shielding pad 120, the material dispensing apparatus 200 may detect the posture of the printed circuit board 110 in the XY plane in which the printed circuit board 110 is placed and may set a start point Ap of the nozzle 216 for discharging the material. In order to detect the posture of the printed circuit board 110 after loading, the material dispensing apparatus 200 may include a PCB reference position detection sensor 233 and a PCB height measurement sensor 234.

The PCB reference position detection sensor 233 is a sensor for identifying the correct position of the PCB loading, and a vision camera may be used as the PCB reference position detection sensor 233. The PCB reference position detection sensor 233 detects whether the printed circuit board 110 loaded in the work space to form a shielding structure is located at a preset position or how much the position of the printed circuit board differs from the predetermined position. For example, when the printed circuit board is loaded into the working position, the controller 250 moves the PCB reference position detection sensor 233 to the coordinates of a first reference mark set in advance and photographs the first reference mark of the current printed circuit board. Then, the controller 250 compares the first reference mark currently photographed with the shape of the preset first reference mark and identifies whether the PCB reference position detection sensor 233 is in place.

When it is identified that the PCB reference position detection sensor 233 is in place, the controller 250 calculates position difference between the coordinates of the current first reference mark and the coordinates of the first reference mark set in advance. Then, the controller 250 calculates the position difference between the coordinates of the current second reference mark and the coordinates of the second reference mark set in advance, in the same manner as the method of calculating the coordinates of the first reference mark.

The material dispensing apparatus 200 may have a PCB supply and discharge portion 235 for loading the printed circuit board to the working position to form the shielding pad 120 on the printed circuit board and unloading the printed circuit board after the formation of the shielding pad 120 is completed.

The material dispensing apparatus 200 may include a PCB heater 236 for raising the printed circuit board to a predetermined temperature to shorten the drying time of the formed shielding pad 120.

The material dispensing apparatus 200 may include an input portion 253 through which a user may directly input a moving path of the nozzle 216. The input portion 253 may be implemented with a touch screen capable of touch input or a conventional keypad. The user can input the moving path of the nozzle 216 through the input portion 253, respectively. The moving path of each nozzle 216 that is input once by the input portion 253 is stored in the memory 251. Later, the user can modify the nozzle moving path data stored in the memory 251 through the input portion 253.

Hereinafter, a process of inputting the nozzle moving path of the nozzle 216 through the input portion 253 will be described.

First, at least two reference marks, which are displayed on a printed circuit board loaded into a working position, are photographed through the PCB reference position detection sensor 233 (for example, a vision camera, hereinafter referred to as a vision camera), the distance between the two reference marks is measured, and then the image of each reference mark and the distance value between the two reference marks are stored in the memory 251. When the printed circuit board is rectangular, the two reference marks may be displayed at the upper left and lower right of the printed circuit board. In this case, the distance between the two reference marks may represent substantially a straight line length in the diagonal direction of the printed circuit board.

Specifically, when the printed circuit board is loaded into the working position, the user moves the vision camera to the position of the first reference mark on the upper left side (for example, based on the center of first reference mark or a part of the first reference mark) through the front, back, left, and right movement buttons provided on the input portion 253, and then presses a storage button provided on the input portion 253. Then, the controller 250 calculates the coordinates (X1, Y1, Z1) of the first reference mark by calculating the distance of the first reference mark from the preset origin (0, 0, 0) and stores it in the memory 251. The photographing position of the vision camera moving together with the nozzle 216 is offset from the center of the nozzle 216 by a predetermined distance. Accordingly, the coordinates (X1, Y1, Z1) of the first reference mark are calculated by the controller 250 in consideration of the offset value. Further, when the user presses a photographing button, the image of the first reference mark is stored in the memory 251.

The user moves the vision camera to the position of the second reference mark on the lower right side (for example, based on the center of second reference mark or a part of the second reference mark) through the front, back, left, and right movement buttons provided on the input portion 253, and then presses the storage button provided on the input portion 253. Then, the controller 250 calculates the coordinates (X2, Y2, Z2) of the second reference mark by calculating the distance of the second reference mark from the preset origin (0, 0, 0) and stores it in the memory 251. Further, when the user presses the photographing button, the image of the second reference mark is stored in the memory 251. The coordinates (X2, Y2, Z2) of the second reference mark are calculated by the controller 250 in consideration of the offset value in the same manner as the process of calculating the coordinates (X1, Y1, Z1) of the first reference mark.

The controller 250 calculates the interval between the two positions using the positions of the first and second reference marks detected as described above, and stores the calculated interval in the memory 251.

The user moves the vision camera along the path of the shielding pad 120 to be formed on the printed circuit board 110 by using the front, back, left and right movement buttons (not illustrated) of the input portion 253, and inputs a plurality of coordinates located on the moving path of the nozzle 216 while confirming the real time image taken by the vision camera with the naked eye. When the vision camera is located at a certain point on the moving path of the nozzle 216, the corresponding coordinates are input by pressing a coordinate input button provided on the input portion 253. The input coordinates are stored in the memory 251.

Figure 6:
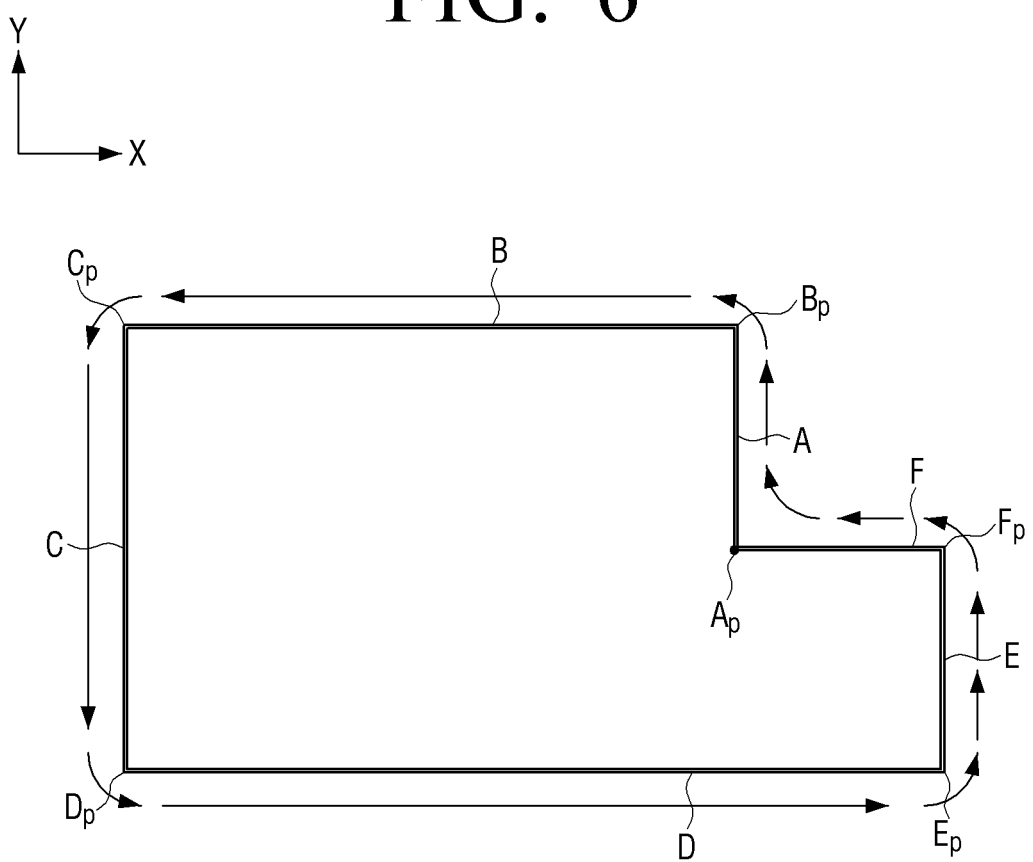
FIG. 6 is a diagram illustrating an example of a path through which a nozzle of a material dispensing apparatus moves according to an example embodiment of the present disclosure.

As illustrated in FIG. 6, the plurality of coordinates may include coordinates of a point (Ap) at which the nozzle 216 starts discharging the material, coordinates of a point at which the nozzle 216 finishes discharging (It may be disposed substantially adjacent to the start point (Ap) when the shielding pad 120 forms a closed curve), and coordinates of the points (Bp, Cp, Dp, Ep and Fp) at which the nozzle 216 changes a direction during movement.

In addition, in order to program the moving path of the nozzle 216, the input portion 253 may include various command buttons such as a movement button for moving the nozzle 216 to the designated coordinates, a line button for giving a command to cause the nozzle 216 to move while discharging the material, a rotation button for changing the moving direction of the nozzle 216, and the like. The user may create the moving path of the nozzle 216 by matching the coordinates and the rotation angle with the command buttons.

When the moving path of the nozzle 216 is programmed by the user as described above, the controller 250 may discharge the insulating material while moving the nozzle 216 along the nozzle moving path, thereby automatically forming the shielding pad 120 on the printed circuit board 110.

The data regarding the moving path of the nozzle 216 input through the input portion 253 may be stored in the memory 251. The controller 250 operates the XYZ axis mover 231 and the rotation driver 219 according to the moving path data of the nozzle 216 stored in the memory 251 to move the nozzle 216 along the previously input path. The nozzle moving path data may include a distance that the nozzle 216 moves in a linear direction along the top surface of the printed circuit board 110 and the rotation direction and angle of the nozzle 216.

In the present example embodiment, the user directly inputs the moving path of the nozzle 216 through the input portion 253, but the present disclosure is not limited thereto. The nozzle moving path may be stored in advance in the memory 251. In this case, a plurality of moving paths for the nozzle 216 may be previously stored to correspond to the patterns of the shielding pad 120, which are formed variously according to the products. Further, calibration information, nozzle reference position information, PCB reference position information, PCB reference height information, and the like may be previously stored in the memory 251 in addition to the moving path of the nozzle input through the input portion 253.

Referring to FIG. 5, the nozzle 216 is provided with a side discharge port 216a formed at a lower side surface and a bottom discharge port 216b, through which a shielding material is discharged, formed at the bottom of the nozzle 216. Accordingly, the shielding material is simultaneously discharged from the side discharge port 216a and the bottom discharge port 216b of the nozzle 216, and is formed on the printed circuit board 110.

The side discharge port 216a may have a substantially rectangular shape having a width w and a height h. The width and thickness of the shielding pad 120 may be determined depending on the width w and the height h of the side discharge port 216a.

The bottom discharge port 216b is set to be spaced apart from the top surface of the printed circuit board 110 so as not to interfere with the top surface of the printed circuit board 110 when moving along the predetermined nozzle moving path.

On the other hand, the nozzle 216 forms the shielding pad 120 along the nozzle moving path stored in the memory 251 as described above. A detailed description thereof will be described with reference to FIG. 6.

Referring to FIG. 6, the nozzle 216 is set to the coordinates corresponding to the start point Ap. At this time, the controller 250 operates the rotation driver 219 to rotate the nozzle 216 at a predetermined angle so that the side discharge port 216a of the nozzle 216 faces the direction opposite to the direction in which the nozzle 216 moves.

The nozzle 216 set at the coordinates corresponding to the start point Ap as described above is linearly moved by the XYZ-axis mover 231 by the section A in the +Y direction. Then, the nozzle 216 moves along a section where the path is bent (a section including a point Bp connecting the section A and the section B). In this case, the nozzle 216 is moved by the XYZ-axis mover 231 along the nozzle path and is rotated by the rotation driver 219 such that the side discharge port 216a continues to face the direction opposite to the direction in which the nozzle 216 moves.

The nozzle 216 is moved linearly by the section B in the −X direction by the XYZ-axis mover 231 after passing through the section where the path is bent. In this manner, the nozzle 216 is sequentially passed through the remaining C, D, E, and F sections and returned to the start point Ap by repeating the linear movement and rotation by the XYZ-axis mover 231 and the rotation driver 219, so that path movement of the first nozzle 216 is completed.

In the above description, the shield can 140 is fixed to the shielding pad 120. However, the present disclosure is not limited thereto, and the fixing force of the shield can 140 may be improved through a shielding member or an insulating member which will be further formed. Hereinafter, an example in which the shielding member and the insulating member are further formed will be described.

Figure 7:
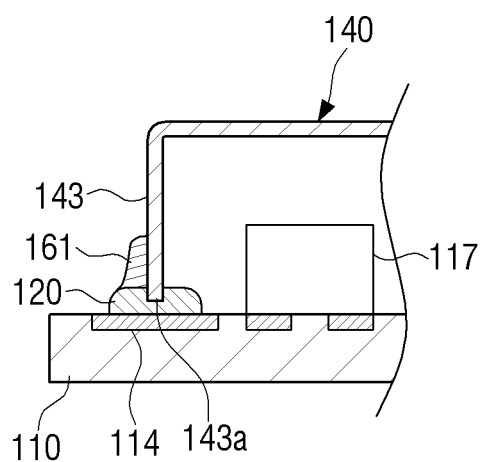
FIG. 7 is a diagram illustrating an example in which a shielding pad and a lower portion of a shield can are at least partially covered with a shielding member to increase a fixing force of the shield can disposed on the shielding pad according to an example embodiment of the present disclosure.
Figure 8:
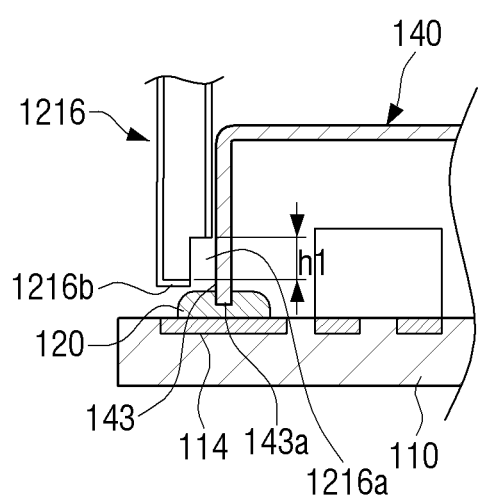
FIG. 8 is a diagram illustrating an example state in which a nozzle for forming the shielding member shown in FIG. 7 is disposed at one side of the shield can according to an example embodiment of the present disclosure.

FIG. 7 is a diagram illustrating an example in which a shielding pad and a lower portion of a shield can are at least partially covered with a shielding member to increase a fixing force of the shield can disposed on the shielding pad in accordance with an example embodiment of the present disclosure, and FIG. 8 is a diagram illustrating a state in which a nozzle for forming the shielding member shown in FIG. 7 is disposed at one side of the shield can according to an example embodiment of the present disclosure.

Referring to FIG. 7, a shielding member (shield) 161 at least partially covers the side wall 143 of the shield can 140 so that the shield can 140 is attached to the shielding pad 120 more firmly. For example, one portion of the shielding member 161 is closely attached along the lower portion of the side wall 143 of the shield can 140, and the other portion of the shielding member 161 is closely attached along a portion of the top surface of the shielding pad 120 located on the outside of the side wall 143.

Accordingly, the attachment area of the shield can 140 to the shielding pad 120 may be indirectly increased through the shielding member 161, so that the shield can 140 is more firmly attached to the shielding pad 120.

The shielding material comprising the shielding member 161 may, for example, and without limitation, be formed of an electroconductive material like the shielding pad 120.

Referring to FIG. 8, a nozzle 1216 for discharging the shielding member 161 may be slightly different in shape from the nozzle 216 for discharging the shielding pad 120 as described above. In other words, the nozzle 1216 for the shielding member 161 may be provided with a side discharge port 1216a through which the electroconductive material is discharged in the side surface of the lower end portion and a bottom guide rib 1216b that guides the electroconductive material to move toward the side discharge port 1216a and is formed in the bottom surface of the lower end portion of the nozzle 1216 so that most of the electrically conductive material is not discharged through the bottom surface of the lower end portion of the nozzle 1216 and moved to the side discharge port 1216a.

The nozzle 1216 discharges the electroconductive material to form the shielding member 161 while moving along the nozzle moving path with the side discharge port 1216a facing the side wall 143 of the shield can 140.

When the nozzle 1216 moves, the bottom guide rib 1216b is spaced apart from the top surface of the shielding pad 120 by a predetermined distance so as not to touch the shielding pad 120. This is a measure for preventing the preformed shielding pad 120 from being damaged by the nozzle 1216.

The height h1 of the side discharge port 1216a of the nozzle 1216 determines the height of the shielding member 161 and may be higher than the height h of the side discharge port 216a of the nozzle 216 for forming the shielding pad 120.

The nozzle 1216 may be additionally provided in the dispenser 212 (see, e.g., FIG. 4) of the above-described material dispensing apparatus 200.

Figure 9:
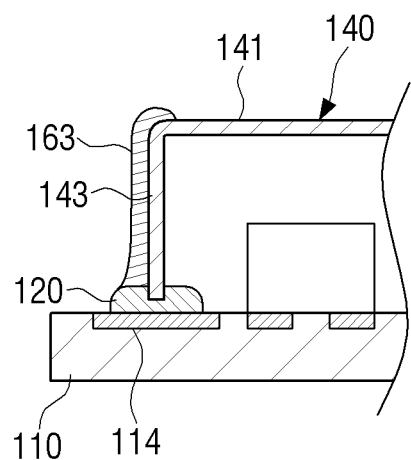
FIG. 9 is a diagram illustrating an example in which a shielding pad and a side surface and a portion of a top surface of a shield can are covered with a shielding member to increase a fixing force of the shield can disposed on the shielding pad according to an example embodiment of the present disclosure.
Figure 10:
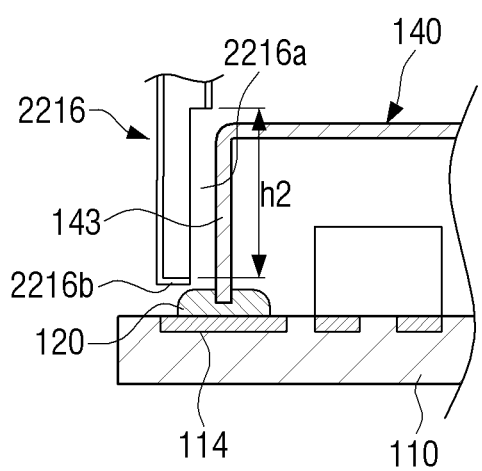
FIG. 10 is a diagram illustrating an example state in which a nozzle for forming the shielding member shown in FIG. 9 is disposed at one side of the shield can according to an example embodiment of the present disclosure.

FIG. 9 is a diagram illustrating an example in which a shielding pad and a side surface and a portion of a top surface of a shield can are covered with a shielding member to increase a fixing force of the shield can disposed on the shielding pad according to an example embodiment of the present disclosure, and FIG. 10 is a diagram illustrating a state in which a nozzle for forming the shielding member shown in FIG. 9 is disposed at one side of the shield can according to an example embodiment of the present disclosure.

Referring to FIG. 9, another shielding member 163 formed higher than the shielding member 161 shown in FIG. 7 may be formed on the side wall 143 of the shield can 140.

The shielding member 163 may cover the entire side wall 143 of the shield can 140 and an edge portion of the top plate 141 of the shield can 140. Accordingly, the shielding member 163 is closely attached to the entire side wall 143 of the shield can 140, the lower end portion thereof is closely attached along a portion of the top surface of the shielding pad 120 located on the outside of the side wall 143, and the upper end portion thereof is closely attached to the edge portion of the top plate 141 of the shield can 140.

The attachment area of the shield can 140 to the shielding pad 120 may be indirectly increased through the shielding member 163, so that the shield can 140 is more firmly attached to the shielding pad 120.

Referring to FIG. 10, a nozzle 2216 for forming the shielding member 163 may have a slightly similar shape to that of the nozzle 1216 for forming the shielding member 161 as described above. In other words, the nozzle 2216 for the shielding member 163 may be provided with a side discharge port 2216a through which the electroconductive material is discharged in the side surface of the lower end portion and a bottom guide rib 2216b that guides the electroconductive material to move toward the side discharge port 2216a and is formed in the bottom surface of the lower end portion of the nozzle 2216 so that most of the electroconductive material is not discharged through the bottom surface of the lower end portion of the nozzle 2216 and moved to the side discharge port 2216a.

The nozzle 2216 discharges the electroconductive material to form the shielding member 163 while moving along the nozzle moving path with the side discharge port 2216a facing the side wall 143 of the shield can 140. When the nozzle 2216 moves, the bottom guide rib 2216b is spaced apart from the top surface of the shielding pad 120 by a predetermined distance so as not to touch the shielding pad 120. This is a measure for preventing the preformed shielding pad 120 from being damaged by the nozzle 2216.

The height h2 of the side discharge port 2216a of the nozzle 2216 determines the height of the shielding member 163 and may be higher than the height h1 of the side discharge port 1216a of the nozzle 1216 for forming the shielding member 161 as described above.

The nozzle 2216 may be additionally provided in the dispenser 212 (see, e.g., FIG. 4) of the above-described material dispensing apparatus 200.

Figure 11:
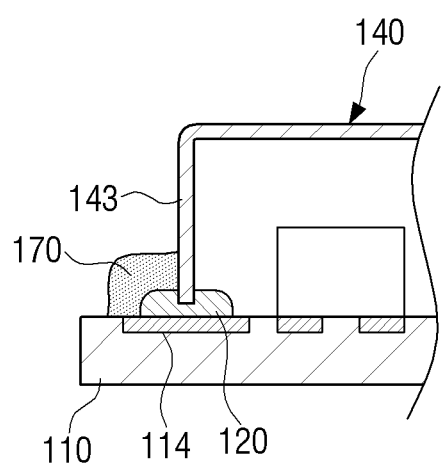
FIG. 11 is a diagram illustrating an example in which a shielding pad and a lower portion of a shield can are at least partially covered with an insulating member to increase a fixing force of the shield can disposed on a shielding pad according to an example embodiment of the present disclosure.
Figure 12:
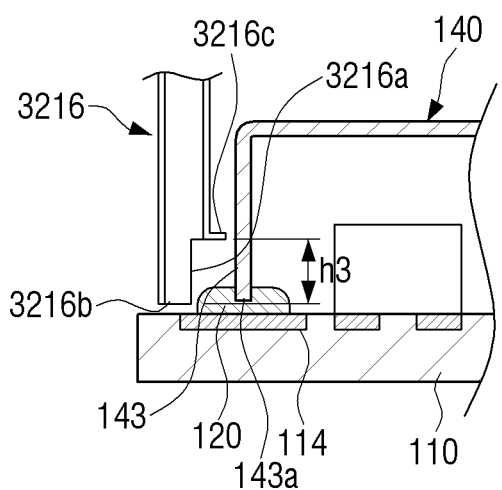
FIG. 12 is a diagram illustrating an example state in which a nozzle for forming the insulating member shown in FIG. 11 is disposed at one side of the shield can according to an example embodiment of the present disclosure.
Figure 13:
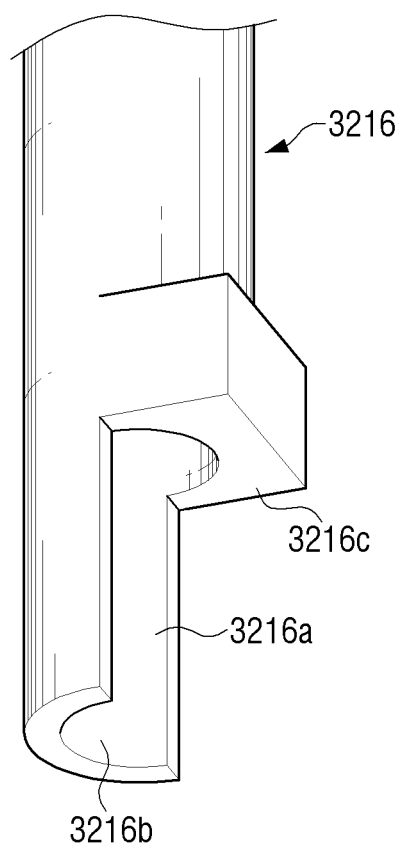
FIG. 13 is a perspective view illustrating the nozzle illustrated in FIG. 12.

FIG. 11 is a diagram illustrating an example in which a shielding pad is covered with an insulating member and a lower portion of a shield can is at least partially covered with an insulating member to increase a fixing force of the shield can disposed on a shielding pad according to an example embodiment of the present disclosure. FIG. 12 is a diagram illustrating a state in which a nozzle for forming the insulating member shown in FIG. 11 is disposed at one side of the shield can according to an example embodiment of the present disclosure, and FIG. 13 is a perspective view illustrating the nozzle illustrated in FIG. 12.

Referring to FIG. 11, the side wall 143 of the shield can 140 may be at least partially covered with the insulating member (insulator) 170 instead of the shielding members 161 and 163 as described above so that the shield can 140 is attached to the shielding pad 120 more firmly. In this case, the insulating member 170 is closely attached to the lower portion of the side wall 143 of the shield can 140, a portion of the top surface of the shielding pad 120 located on the outside of the side wall 143, and a portion of the printed circuit board 110.

The insulating material comprising the insulating member 170 may be a thixotropic material having fluidity or a phase change (thermoplastic, thermosetting) material, or the like, but is not limited thereto.

The thixotropic materials may include synthetic fine silica, bentonite, particulate surface treated calcium carbonate, hydrogenated castor oil, metal soap system, aluminum stearate, polyamide wax, oxidized polyethylene and linseed polymerized oil, or the like. For example, the metal soap system may include aluminum stearate.

The phase change materials may include polyurethane, polyurea, polyvinyl chloride, polystyrene, acrylonitrile butadiene styrene (ABS) resin, polyamide, acrylic, epoxy, silicone, and polybutylene terephthalate (PBTP), or the like.

The viscosity of the insulating material may, for example, and without limitation, be about 20,000 cps to 5,000,000 cps so that the insulating material discharged from the nozzle 3216 (see FIG. 12) does not flow down and maintains a certain shape.

Since the insulating material forming the insulating member (insulator) 170 is cheaper than the electroconductive material comprising the shielding pad 120 and the shielding members 161 and 163 described above, the manufacturing cost may be reduced.

Referring to FIGS. 12 and 13, the nozzle 3216 for dispensing and forming the insulating member 170 is provided with a side discharge port 3216a formed in the side surface of the lower end of the nozzle 3216 and a bottom discharge port 3216b formed in the bottom surface of the lower end. The insulating material is simultaneously discharged through the side discharge port 3216a and the bottom discharge port 3216b. In this case, the nozzle 3216 for discharging the insulating material is disposed father from the side wall 143 of the shield can 140 than the nozzles 1216 and 2216 for forming the shielding members 161 and 163 described above. Accordingly, the insulating material discharged through the side discharge port 3216a may be discharged from the side discharge port 3216a and then ascend along the side wall 143. To guide this, the nozzle 3216 may be provided with a guide rib 3216c projecting from the upper end of the side discharge port 3216a.

The height h3 of the side discharge port 3216a of the nozzle 3216 determines the height of the insulating member 170 and may be higher than the height h of the side discharge port 216a of the nozzle 216 for forming the shielding pad 120 as described above so that the insulating member 170 covers the shielding pad 120.

The nozzle 3216 may also be additionally provided in the dispenser 212 (see, e.g., FIG. 4) of the above-described material dispensing apparatus 200.

Hereinafter, various examples in which a side wall 1143 of a shield can 1140 has a bent lower end portion 1143a to be more firmly attached to the shielding pad 120 will be described in greater detail.

Figure 14:
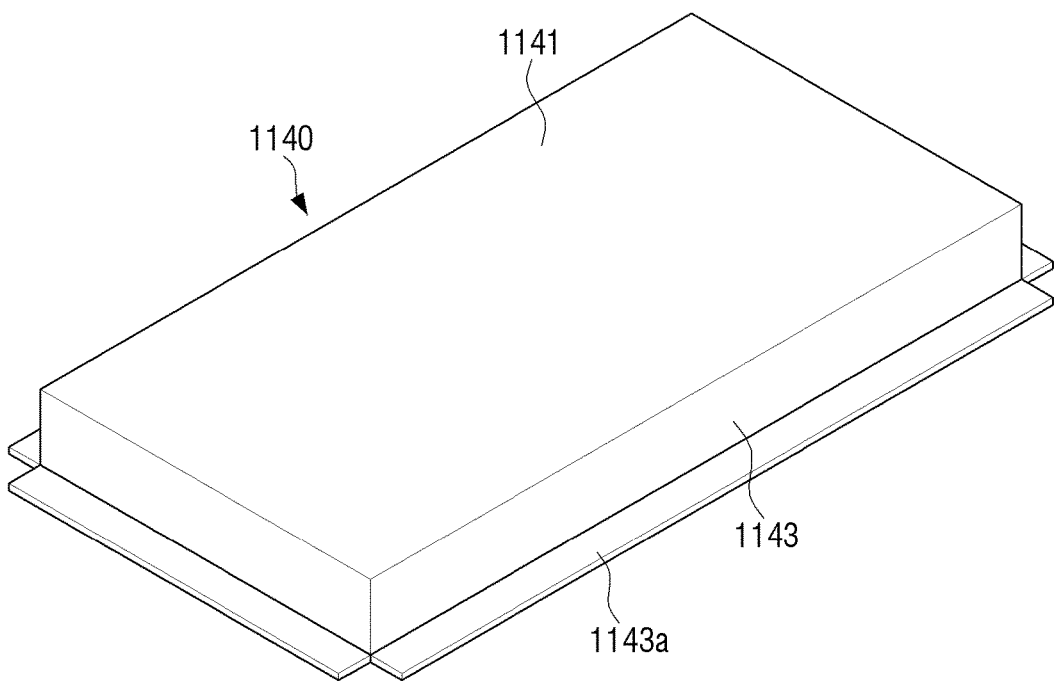
FIG. 14 is a perspective view illustrating an example in which a lower end portion of a shield can is bent according to an example embodiment of the present disclosure.
Figure 15:
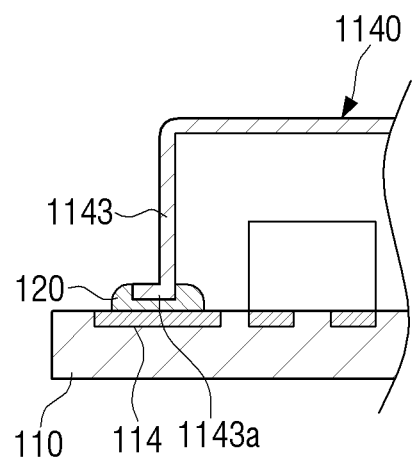
FIG. 15 is a diagram illustrating an example in which a shield can having a bent lower end portion is disposed on a shielding pad according to an example embodiment of the present disclosure.

FIG. 14 is a perspective view illustrating an example in which the lower end portion of a shield can is bent according to an example embodiment of the present disclosure. FIG. 15 is a diagram illustrating an example in which a shield can having a bent lower end portion is disposed on a shielding pad according to an example embodiment of the present disclosure.

Referring to FIG. 14, the shield can 1140 includes a top plate 1141 and side walls 1143 bent downward from the top plate 1141 similarly to the shield can 140 described above. The lower end portions 1143a of the side walls 1143 are bent toward the outside of the shield can 1140.

Referring to FIG. 15, the bent lower end portion 1143a of the side wall 1143 may be embedded in the upper portion of the shielding pad 120. In this case, since the lower end portion 1143a is in contact with the shielding pad 120 in a wider area than the shield can 140 described above, the lower end portion 1143a may be more stably fixed to the shielding pad 120.

Figure 16:
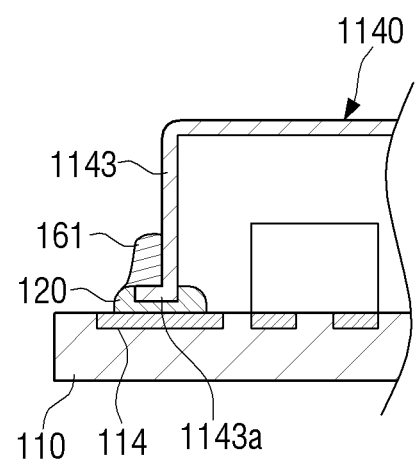
FIG. 16 is a diagram illustrating an example in which a shielding pad and a lower portion of a shield can are at least partially covered with a shielding member to increase a fixing force of the shield can having a bent lower end portion disposed on the shielding pad according to an example embodiment of the present disclosure.

FIG. 16 is a diagram illustrating an example in which a shielding pad and a lower portion of a shield can are at least partially covered with a shielding member to increase a fixing force of the shield can having a bent lower end portion disposed on the shielding pad according to an example embodiment of the present disclosure.

Referring to FIG. 16, the shielding member 161 may be formed to cover a portion of the side wall 1143, the top surface of the bent lower end portion 1143a, and a portion of the shielding pad 120 in the state in which the bent lower end portion 1143a of the side wall 1143 of the shield can 1140 is attached to and/or embedded in the shielding pad 120 as illustrated in FIG. 15.

Accordingly, the attachment area of the shield can 1140 to the shielding pad 120 may be indirectly increased through the shielding member 161, so that the shield can 1140 is more firmly attached to the shielding pad 120.

Figure 17:
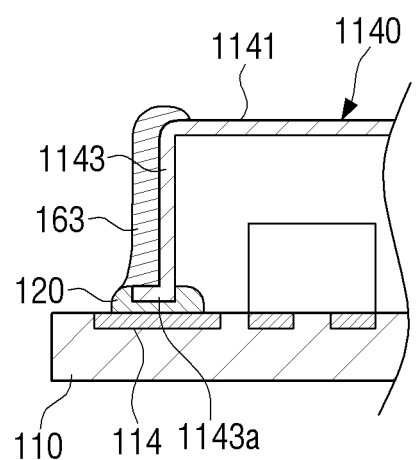
FIG. 17 is a diagram illustrating an example in which a shielding pad and a side surface and a portion of a top surface of a shield can are covered with a shielding member to increase a fixing force of the shield can having a bent lower end portion disposed on the shielding pad according to an example embodiment of the present disclosure.

FIG. 17 is a diagram illustrating an example in which a shielding pad and a side surface and a portion of a top surface of a shield can are at least partially covered with a shielding member to increase a fixing force of the shield can having a bent lower end portion disposed on the shielding pad according to an example embodiment of the present disclosure.

Referring to FIG. 17, a shield member 163 formed higher than the shielding member 161 illustrated in FIG. 16 may be formed on the side wall 1143 of the shield can 1140.

In other words, the shielding member 163 covers and is closely attached along the edge portion of the top plate 1141 of the shield can 1140, the entire side wall 1143 of the shield can 1140, the top surface of the bent lower end portion 1143a, and a portion of the top surface of the shielding pad 120 located on the outside of the side wall 1143.

In this case, the attachment area of the shield can 1140 to the shielding pad 120 may be indirectly increased through the shielding member 163, so that the shield can 1140 is more firmly attached to the shielding pad 120.

Figure 18:
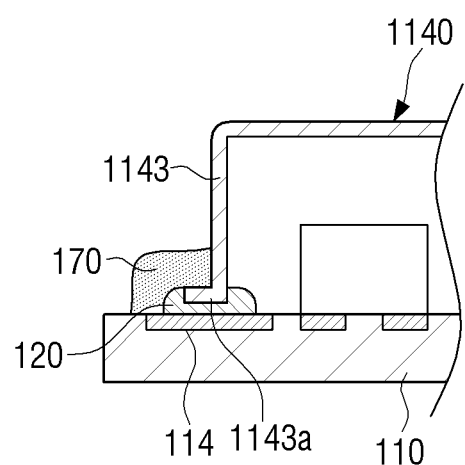
FIG. 18 is a diagram illustrating an example in which a shielding pad and a lower portion of a shield can are at least partially covered with an insulating member to increase a fixing force of the shield can having a bent lower end portion disposed on a shielding pad according to an example embodiment of the present disclosure.

FIG. 18 is a diagram illustrating an example in which a shielding pad and a lower portion of a shield can are covered with an insulating member to increase a fixing force of the shield can having a bent lower end portion disposed on a shielding pad according to an example embodiment of the present disclosure.

Referring to FIG. 18, the side wall 1143 of the shield can 1140 may be at least partially covered with the insulating member 170 instead of the shielding members 161 and 163 described above so that the shield can 1140 is more firmly attached to the shielding pad 120. In this case, the insulating member 170 is closely attached to the lower portion of the side wall 1143 of the shield can 1140, a portion of the top surface of the shielding pad 120 located on the outside of the side wall 1143, and a portion of the printed circuit board 110.

As described above, since the insulating material comprising the insulating member 170 is cheaper than the electrically conductive material comprising the shielding pad 120 and the shielding members 161 and 163 described above, the manufacturing cost may be reduced.

Figure 19:
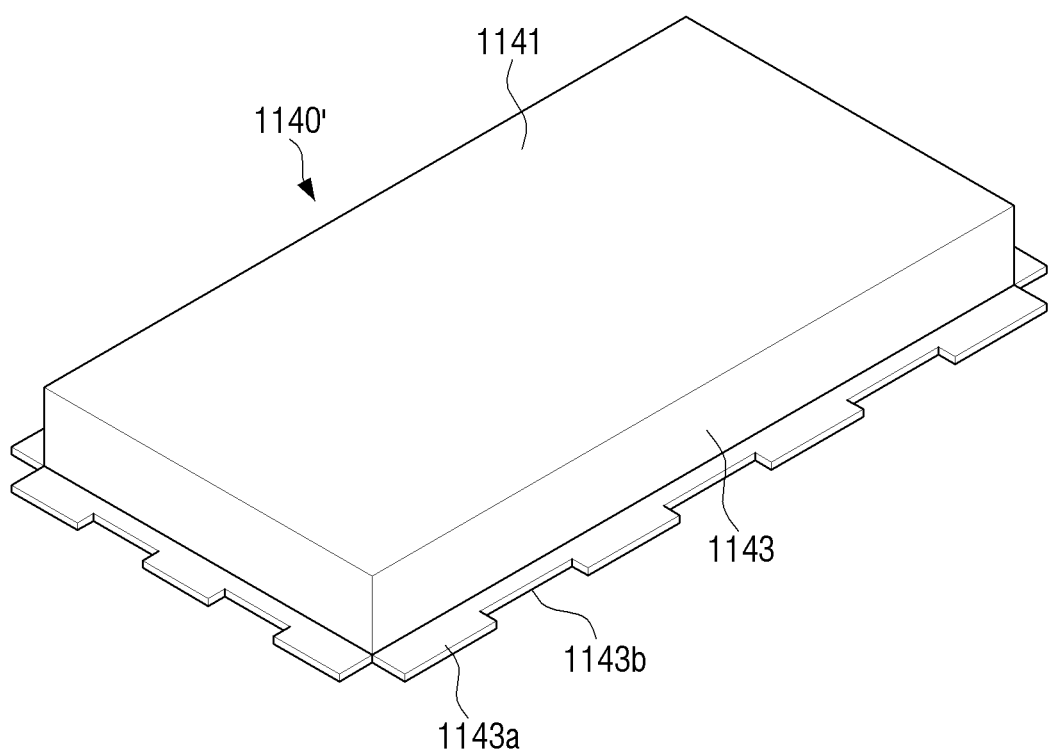
FIG. 19 is a perspective view illustrating an example in which parts of the bent lower end portion of a shield can are cut according to an example embodiment of the present disclosure.

FIG. 19 is a perspective view illustrating an example in which a part of the bent lower end portion of a shield can is cut according to an example embodiment of the present disclosure.

As illustrated in FIG. 19, the shield can 1140' may be cut so that predetermined grooves or notches are formed in the bent lower end portions 1143a. In the case that the lower end portion 1143a formed as described above is applied to the EMI shielding structures as illustrated in FIGS. 16 to 19, when the lower end portion 1143a is embedded in the upper portion of the shielding pad 120, the shielding pad 120 may be pushed into the grooves 1143b to fill the grooves 1143b.

Accordingly, the shielding pad 120 may be in contact with not only the bottom surface of the bent lower end portion 1143a but also the portions comprising the grooves 1143b. Accordingly, the bent lower end portion 1143a may be attached to the shielding pad 120 more firmly than when the grooves 1143b are not present.

Figure 20:
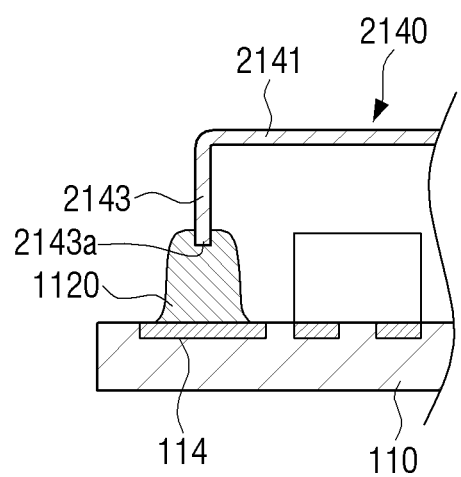
FIG. 20 is a diagram illustrating an example in which a shield can is disposed on a shielding dam according to an example embodiment of the present disclosure.
Figure 21:
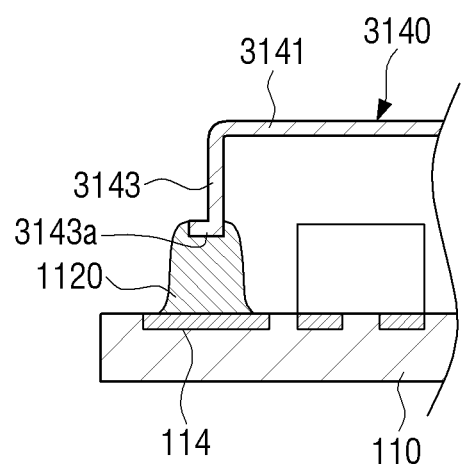
FIG. 21 is a diagram illustrating an example in which a shield can having a bent lower end portion is disposed on a shielding dam according to an example embodiment of the present disclosure.

FIG. 20 is a diagram illustrating an example in which a shield can is disposed on a shielding dam according to an example embodiment of the present disclosure. FIG. 21 is a diagram illustrating an example in which a shield can having bent lower end portions is disposed on a shielding dam according to an example embodiment of the present disclosure.

Referring to FIG. 20, a shielding dam 1120 having a height higher than the thickness of the shielding pad 120 described above may be formed instead of the shielding pad 120. In the case of forming the shielding dam 1120 having the predetermined height as described above, the side wall 2143 of the shield can 2140 may be formed shorter than the side wall 1143 of the shield can 1140 described above.

The lower end portion 2143a of the shield can 2140 may be embedded in and attached to the upper portion of the shielding dam 1120 in a state of being not bent as illustrated in FIG. 20.

Alternatively, as illustrated in FIG. 21, the lower end portion 3143a of the side wall 3143 of the shield can 3140 may be formed to be bent. The bent lower end portion 3143a as described above may be embedded in and attached to the upper portion of the shielding dam 1120. In this case, since the shield can 3140 has a wider contact area with the shielding dam 1120 than the shield can 2140 as illustrated in FIG. 20, the shield can 3140 may be more stably attached to the shielding dam 1120.

In FIG. 20, reference numeral 2141 denotes a top plate of the shield can 2140. In FIG. 21, reference numeral 3141 denotes a top plate of the shield can 3140.

Figure 22:
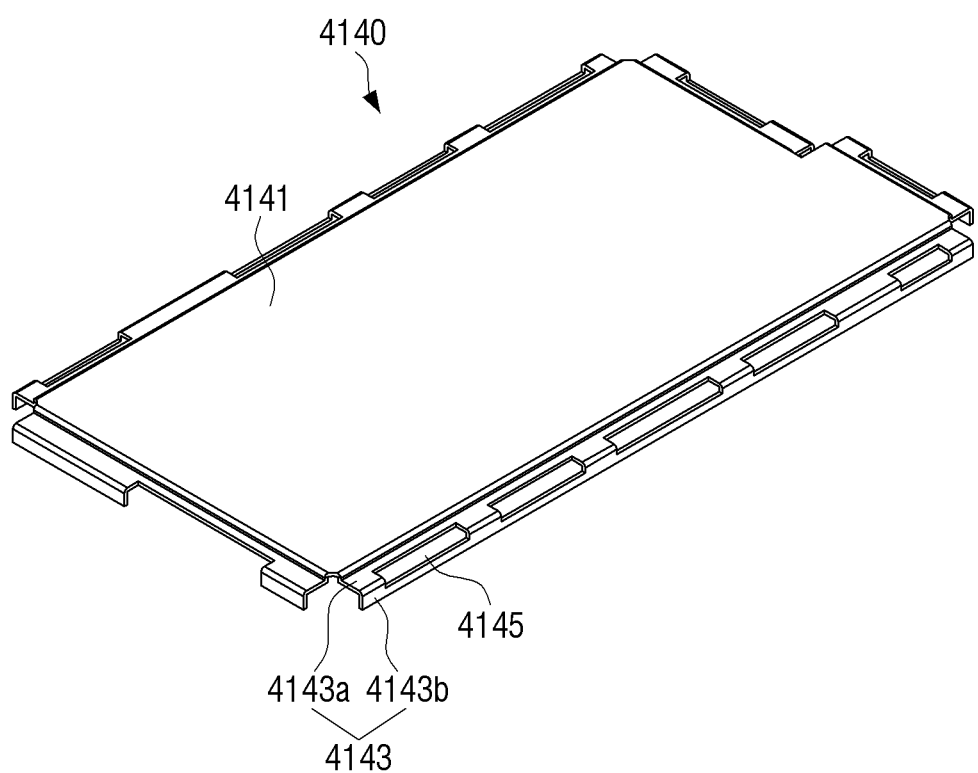
FIG. 22 is a perspective view illustrating an example in which steps are formed along an edge of a shield can according to an example embodiment of the present disclosure.
Figure 23:
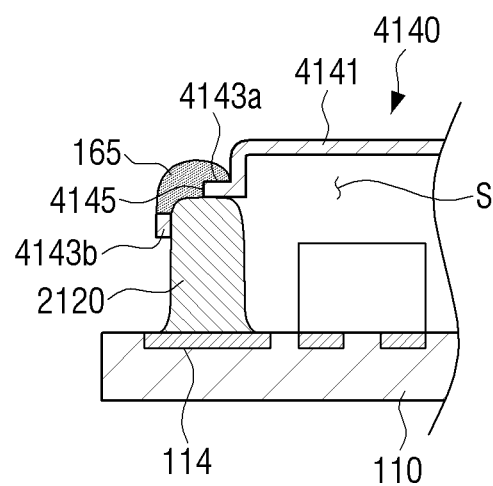
FIG. 23 is a diagram illustrating an example in which the shield can illustrated in FIG. 22 is disposed on a shielding dam according to an example embodiment of the present disclosure.

FIG. 22 is a perspective view illustrating an example in which steps are formed along an edge of a shield can according to an example embodiment of the present disclosure, and FIG. 23 is a diagram illustrating an example in which the shield can illustrated in FIG. 22 is disposed on a shielding dam according to an example embodiment of the present disclosure.

Referring to FIG. 22, a shield can 4140 comprises a conductive metal material like the shield can 140 as described above, and may have an area corresponding to the shielded region to cover the entire shielded region. Since the shield can 4140 is formed in a plate shape having a predetermined thickness, the shield can 4140 may have rigidity, thereby securing structural stability.

The shield can 4140 may include a top plate 4141 and a seating portion 4143 formed along the rim of the top plate 4141. The top plate 4141 is substantially flat and covers the upper portion of the shielded region partitioned by the shielding dam 2120 (see, e.g., FIG. 23). In this case, the top plate 4141 may be provided with at least one air discharging hole (not illustrated) for discharging the thermally expanded air in the insulating space S (see, e.g., FIG. 23) formed between the printed circuit board 110, the shielding dam 2120, and the shield can 4140.

Referring to FIG. 23, the seating portion 4143 is seated on the upper portion of the shielding dam 2120, and may be provided with a step so that the seating portion 4143 has a predetermined height difference from the top plate 4141. In other words, the seating portion 4143 may be formed at a lower position than the top plate 4141. Since the shield can 4140 is provided with the step between the top plate 4141 and the seating portion 4143, a predetermined gap may be formed between the bottom surface of the top plate 4141 and the top end of the circuit component.

The seating portion 4143 may include a first portion 4143a that is in contact with the top surface of the shielding dam 2120 and a second portion 4143b that is substantially downwardly bent from the end of the first portion 4143a. The shield can 4140 may be seated substantially on the shielding dam 2120 by the first portion 4143*a*. The second portion 4143*b* may be in contact with the upper side surface of the shielding dam 2120.

The shield can 4140 may be electrically connected to the shielding dam 2120 by an adhesive portion 165. The adhesive portion 165 comprises a conductive material. When the adhesive portion 165 is applied to the seating portion 4143 of the shield can 4140, the adhesive portion 165 flows into a plurality of slots 4145 formed in the seating portion 4143 to be in contact with the shielding dam 2120. When the adhesive portion 165 is thermally cured after being applied to the seating portion 4143, the seating portion 4143 and the shielding dam 2120 may be firmly bonded to each other by the adhesive portion 165. Accordingly, the shield can 4140 is electrically connected to the shielding dam 2120, and may be stably fixed to the shielding dam 2120 in terms of structure. In the present embodiment, various curing methods such as, for example, and without limitation, may include curing using ultraviolet (UV), infrared (IR), and halogen lamp, natural curing, oven curing, or the like may be applied to cure the adhesive portion 165.

On the other hand, the plurality of slots 4145 formed in the seating portion 4143 may be formed at the same time in the first portion 4143*a* and the second portion 4143*b* of the seating portion 4143, respectively. In other words, the plurality of slots 4145 are formed to pass through the corner portions where the first portion 4143*a* and the second portion 4143*b* contact with each other. In this case, the plurality of slots 4145 may have a sufficient area to allow the adhesive portion 165 to flow into each slot 4145 when the adhesive portion 165 is applied.

Hereinafter, an EMI shielding structure according to another example embodiment of the present disclosure will be described in greater detail below with reference to FIGS. 24 to 26.

Figure 24:
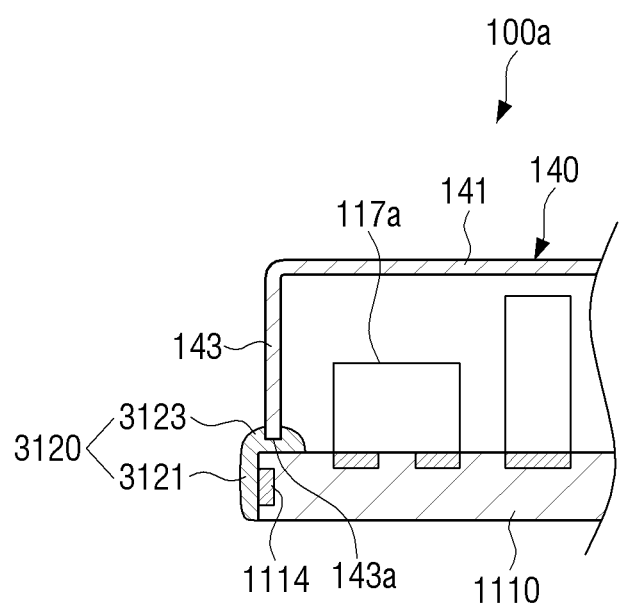
FIG. 24 is a cross-sectional view illustrating an example EMI shielding structure according to another example embodiment of the present disclosure.

FIG. 24 is a cross-sectional view illustrating an EMI shielding structure according to another example embodiment of the present disclosure. FIG. 25 is a diagram illustrating an example of forming a shielding pad at an end portion of a printed circuit board according to an example embodiment of the present disclosure. FIG. 26 is a plan view illustrating an example in which a shielding pad is formed on an end portion and a top surface of a printed circuit board according to an example embodiment of the present disclosure.

Referring to FIG. 24, an EMI shielding structure 100*a* according to another example embodiment of the present disclosure is substantially the same as the EMI shielding structure 100 according to an embodiment of the present disclosure as described above with the shape and forming position of a shielding pad 3120 being different.

The shielding pad 3120 is formed on the end portion of the printed circuit board 1110. Specifically, the shielding pad 3120 is formed along the side surface and the edge portion of the top surface of the printed circuit board 1110. A first portion 3121 of the shielding pad 3120 is formed on the side surface of the printed circuit board 1110 and a second portion 3123 is formed on the edge portion of the top surface of the printed circuit board 1110. A ground pad 1114 may be formed on the side surface of the printed circuit board 1110 and is in electrically contact with the first portion 3121 of the shielding pad 3120. The ground pad 1114 may be connected to a ground layer (not illustrated) formed as a predetermined region inside the printed circuit board 1110.

Figure 25:
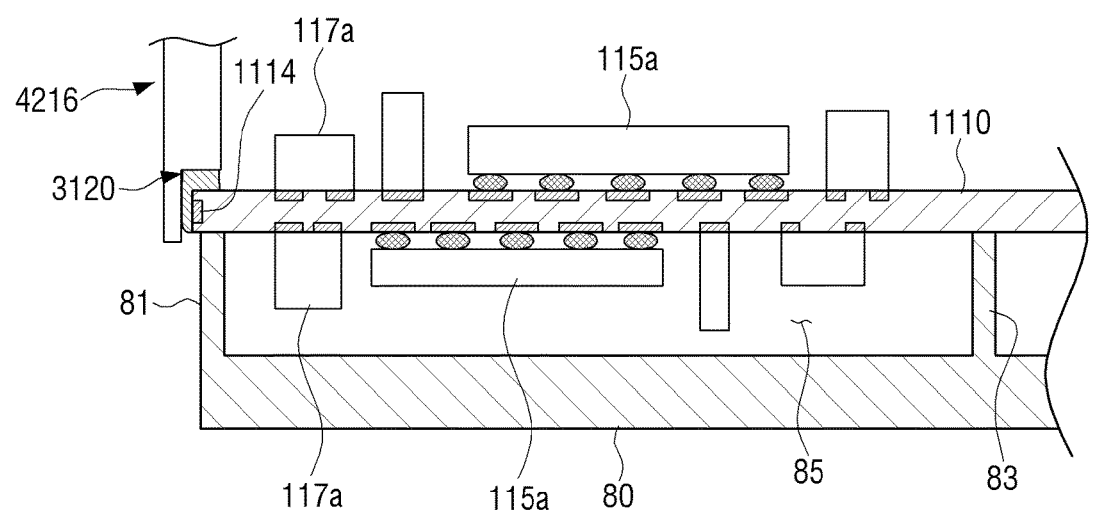
FIG. 25 is a diagram illustrating an example of forming a shielding pad on an end portion of a printed circuit board according to an example embodiment of the present disclosure.

The first and second portions 3121 and 3123 of the shielding pad 3120 may be simultaneously formed by a nozzle 4216 as illustrated in FIG. 25.

In order to form the shielding pad 3120 on the end portion of the printed circuit board 1110 as described above, one surface of the printed circuit board 1110 (the bottom surface of the printed circuit board 1110 in FIG. 25) may be supported by a plurality of supporters 83 of a die 80. In this case, a space 85 having a predetermined depth may be formed between the pluralities of supporters 83 so that the circuit components 115*a* and 117*a* mounted on the bottom surface of the printed circuit board 1110 do not interfere with the top surface of the die 80.

Referring to FIG. 25, a material discharge port of the nozzle 4216 is positioned to face the end portion of the printed circuit board 1110 in a state in which the printed circuit board 1110 is supported by the plurality of supporters 83. The nozzle 4216 moves along the predetermined nozzle moving path and discharges the electroconductive material toward the end portion of the printed circuit board 1110 to form the shielding pad 3120 on the end portion of the printed circuit board 1110.

Figure 26:
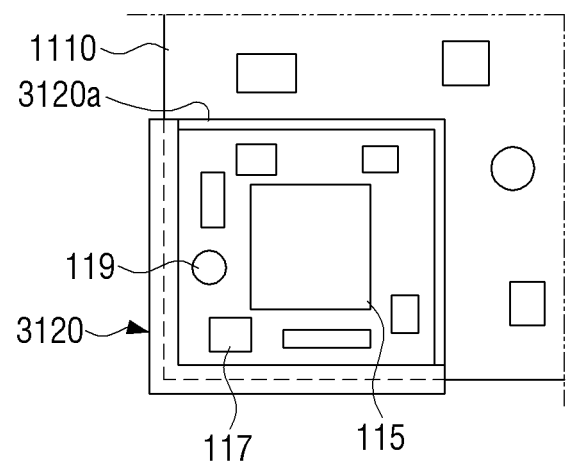
FIG. 26 is a plan view illustrating an example in which a shielding pad is formed on an end portion and a top surface of a printed circuit board according to an example embodiment of the present disclosure.

Referring to FIG. 26, the shielding pad 3120 may be formed along the end portion of a corner of the printed circuit board 1110. Another shielding pad 3120*a* may be formed to connect both ends of the shielding pad 3120 along the top surface of the printed circuit board 1110.

The other shielding pad 3120*a* formed on the top surface of the printed circuit board 1110 may be formed to have the same thickness and width as the shielding pad 3120 as described above.

The shielding pads 3120 and 3120*a* formed on the end portion and the top surface of the printed circuit board 1110 may together form a closed curve as illustrated in FIG. 26 in consideration of the shielding performance. However, the present disclosure is not limited thereto. As another example, the shielding pad 3120 may be formed to be disconnected from each other without forming a closed curve.

The lower end 143*a* of a section of the side wall 143 of the shield can 140 may be embedded in and attached to the upper portion of the second portion 3123 of the shielding pad 3120 as illustrated in FIG. 24, and the lower end 143*a* of the remaining section of the side wall 143 may be embedded in and attached to the shielding pad 3120*a* (see FIG. 26) formed on the top surface of the printed circuit board 1110.

Figures 27A, 27B:
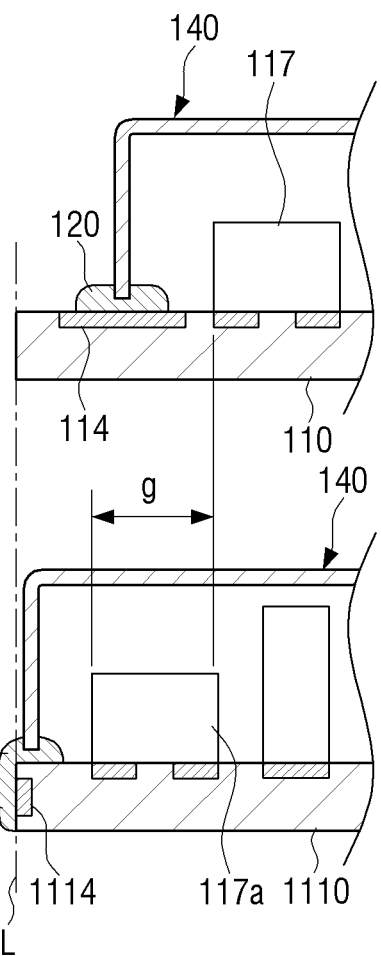
FIGS. 27A and 27B are diagrams comparing example integration rates of components mounted on a printed circuit board between an example embodiment of the present disclosure and another example embodiment of the present disclosure.

FIGS. 27A and 27B are diagrams comparing example integration rates of components mounted on a printed circuit board between an embodiment and another embodiment of the present disclosure. FIG. 27A illustrates an example in which the shielding pad 120 is formed on the top surface of the printed circuit board 110, and FIG. 27B illustrates an example in which the shielding pad 3120 is formed on the end portion of the printed circuit board 1110.

When the side surfaces of the printed circuit boards 110 and 1110 are disposed to be aligned with the reference line L as illustrated in FIGS. 27A and 27B, the circuit component 117*a* mounted on the printed circuit board 1110 of FIG. 27B may be disposed closer to the reference line L by a certain distance g as compared to the circuit component 117 mounted on the printed circuit board 110 of FIG. 27A. When the shielding pad 3120 is formed on the end portion of the printed circuit board 1110 as described above, the circuit components may be mounted at a higher integration ratio than when the shielding pad 120 is formed on the top surface of the printed circuit board 110.

Figure 28A:
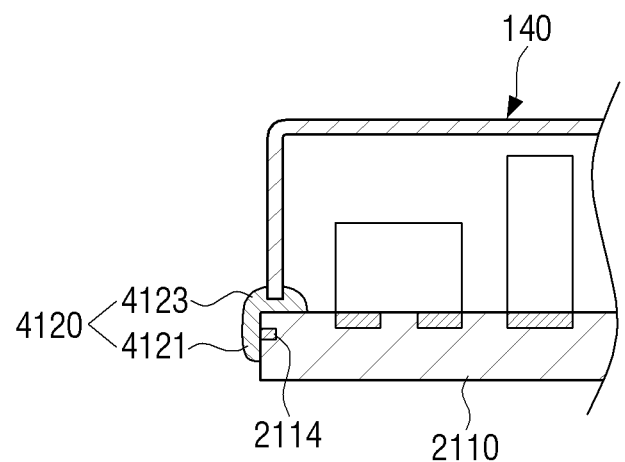
FIGS. 28A and 28B are diagrams illustrating various example arrangements of ground pads formed at an end portion of a printed circuit board according to an example embodiment of the present disclosure.
Figure 28B:
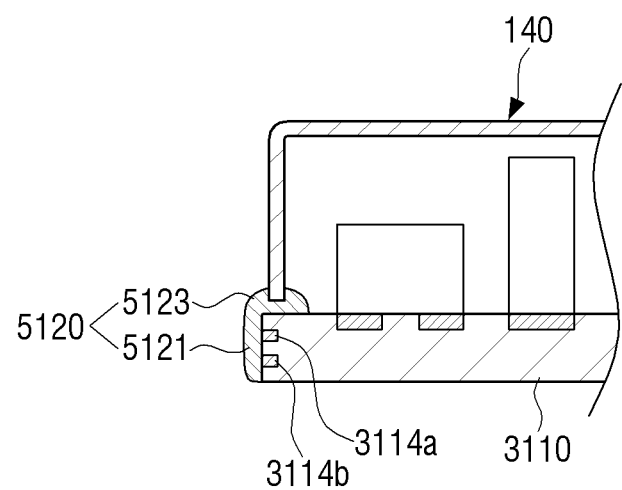

FIGS. 28A and 28B are diagrams illustrating various example arrangements of ground pads formed at the end portion of a printed circuit board according to example embodiments of the present disclosure.

Referring to FIG. 28A, the thickness of the ground pad 2114 may be formed thinner than thickness of the ground pad 1114 as illustrated in FIG. 24. When the ground pad 2114 is formed adjacent to the top surface of the printed circuit board 2110, the length of the first portion 4121 of the shielding pad 4120 formed on the side surface of the printed circuit board 2110 may be long enough to cover the ground pad 2114.

Referring to FIG. 28B, two ground pads 3114a and 3114b may be formed at predetermined interval on the side surface of the printed circuit board 3110. Further, the length of the first portion 5121 of the shielding pad 5120 formed on the side surface of the printed circuit board 3110 may be sufficient to cover the ground pads 3114a and 3114b at the same time.

When the ground pad is formed on the side surface of the printed circuit board as described above, the thickness, the formation position, the number, and the like of the ground pad may be appropriately determined in consideration of the position and the number of the ground layer formed on the printed circuit board, whether the DC power ground layer and the AC power ground layer are present together a single printed circuit board, and the like.

In FIG. 28A, reference numeral 4123 denotes a second portion of the shielding pad 4120, and in FIG. 28B, reference numeral 5123 denotes a second portion of the shielding pad 5120.

Figure 29:
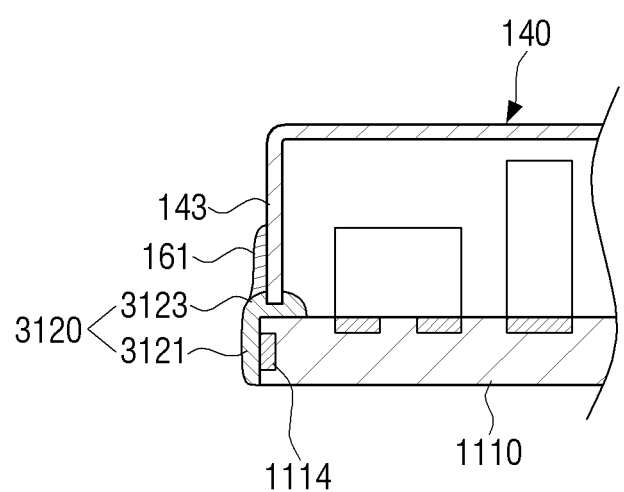
FIG. 29 is a diagram illustrating an example in which a shielding pad formed on an end portion of a printed circuit board and a lower portion of a shield can are at least partially covered with a shielding member according to an example embodiment of the present disclosure.

FIG. 29 is a diagram illustrating an example in which a shielding pad formed on an end portion of a printed circuit board and a lower portion of a shield can are at least partially covered with a shielding member according to an example embodiment of the present disclosure.

Referring to FIG. 29, the shielding member 161 may be formed so that the shield can 140 is more firmly attached to the shielding pad 3120 formed on the end portion of the printed circuit board 1110. A portion of the shielding member 161 is closely attached along the lower portion of the side wall 143 of the shield can 4140 and the other portion is closely attached along the second portion 3123 of the shielding pad 3120.

Accordingly, the attachment area of the shield can 140 to the shielding pad 3120 may be indirectly increased through the shielding member 161, so that the shield can 140 is more firmly attached to the shielding pad 3120.

Figure 30:
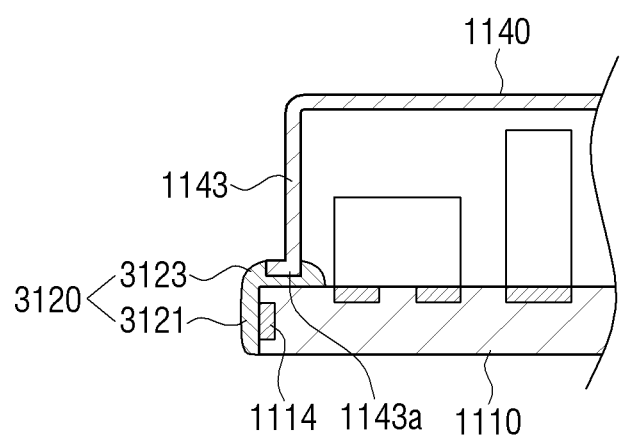
FIG. 30 is a diagram illustrating an example in which a shield can having a bent lower end portion is disposed on a shielding pad formed on an end portion of a printed circuit board according to an example embodiment of the present disclosure.

FIG. 30 is a diagram illustrating an example in which a shield can having a bent lower end portion is disposed on a shielding pad formed on an end portion of a printed circuit board according to an example embodiment of the present disclosure.

Referring to FIG. 30, the bent lower end portion 1143a of the side wall 1143 of the shield can 1140 is embedded in and attached to the second portion 3123 of the shielding pad 3120.

Accordingly, the attachment area of the shield can 1140 to the shielding pad 3120 may be directly increased through the bent lower end portion 1143a, so that the shield can 1140 is more firmly attached to the shielding pad 3120.

In FIGS. 29 and 30, reference numeral 3121 denotes a first portion of the shielding pad 3120.

Figure 31:
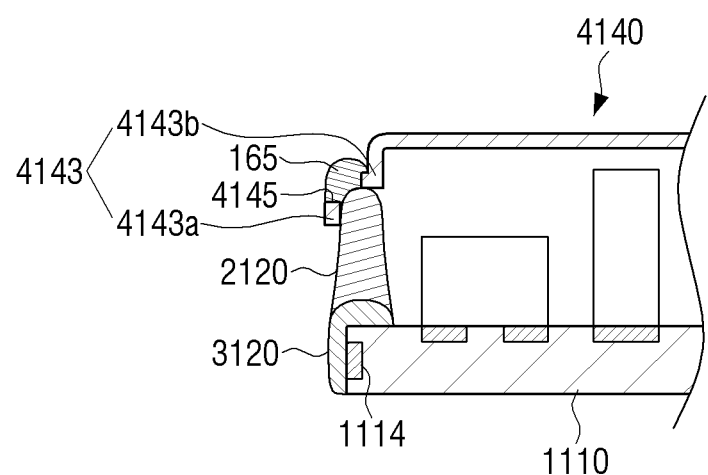
FIG. 31 is a diagram illustrating an example in which a shielding dam is formed on a shielding pad formed on an end portion of a printed circuit board and a shield can is disposed on the shielding dam according to an example embodiment of the present disclosure.

FIG. 31 is a diagram illustrating an example in which a shielding dam is formed on a shielding pad formed on an end portion of a printed circuit board and a shield can is disposed on the shielding dam according to an example embodiment of the present disclosure.

Referring to FIG. 31, a shielding dam 2120 is formed on a shielding pad 3120 formed on an end portion of the printed circuit board 1110, a shield can 4140 having a step on a rim of the shield can 4140 is seated on the upper portion of the shielding dam 2120, and the shielding dam 2120 and the shield can 4140 are connected to each other through the adhesive portion 165.

In this case, the shield can 4140 may be seated on the upper portion of shielding dam 2120 by the first portion 4143a. The second portion 4143b may be in contact with the upper side surface of the shielding dam 2120. The shield can 4140 is electrically connected to the shielding dam 2120 by the adhesive portion 165.

The adhesive portion 165 is applied to the seating portion 4143 of the shield can 4140 and flows into a plurality of slots 4145 formed in the seating portion 4143 to be in contact with the shielding dam 2120. When the adhesive portion 165 is thermally cured after being applied to the seating portion 4143, the seating portion 4143 and the shielding dam 2120 may be firmly bonded to each other by the adhesive portion 165. Accordingly, the shield can 4140 is electrically connected to the shielding dam 2120, and may be stably fixed to the shielding dam 2120 in terms of structure.

In the above description, the shield can is applied to the EMI shielding structure. However, the present disclosure is not limited thereto. The EMI shielding structure may be formed by molding a shielding material and an insulating material by three-dimensional (3D) printing.

Figure 32:
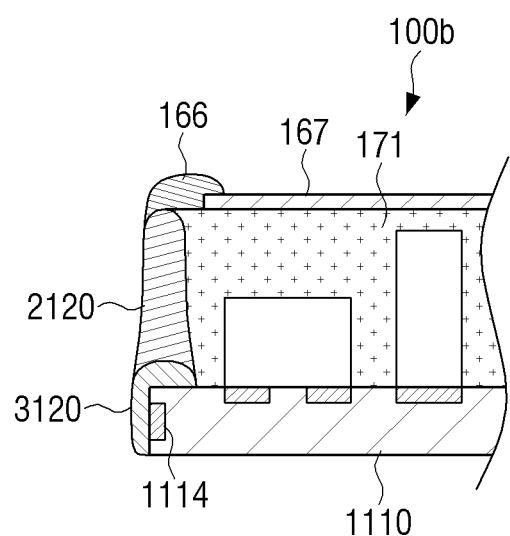
FIGS. 32, 33 and 34 are diagrams illustrating an EMI shielding structure according to other example embodiments of the present disclosure.
Figure 33:
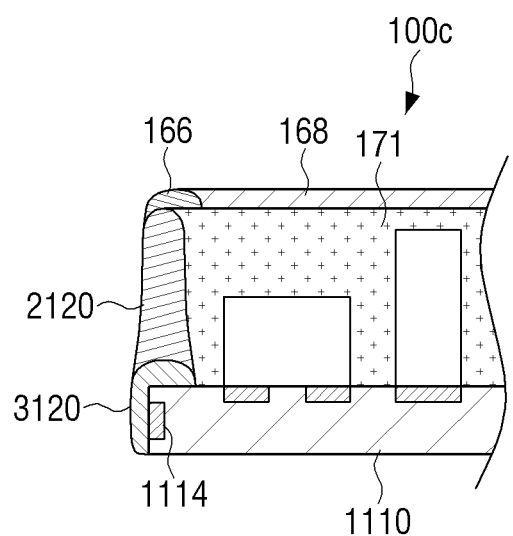
Figure 34:
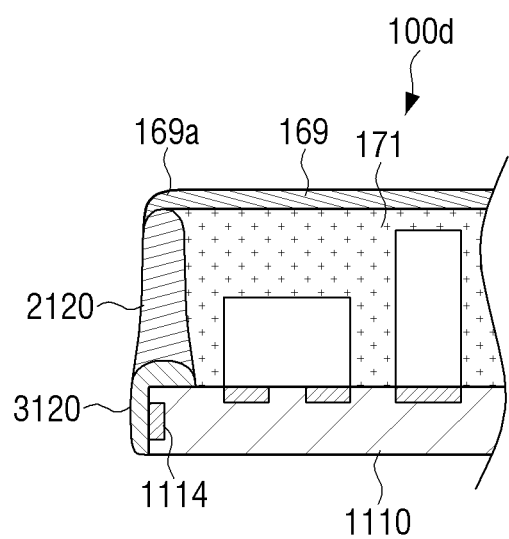

FIGS. 32, 33 and 34 are diagrams illustrating an EMI shielding structure according to other example embodiments of the present disclosure.

Referring to FIG. 32, an EMI shielding structure 100b includes a shielding pad 3120 on the end portion of the printed circuit board 1110 covering the ground pad 1114 formed on the side surface of the printed circuit board 1110.

A shielding dam 2120 is formed on the shielding pad 3120. The shielding dam 2120 substantially surrounds the circuit components to form a substantially closed loop on the printed circuit board 1110. An insulating member (insulator) 171 is injected into a space surrounded by the shielding dam 2120. The height of the insulating member 171 may be approximately the same as the height of the shielding dam 2120.

A shielding film 167 may be attached to the top surface of the insulating member 171. In this case, an edge bridge 166 comprising an electroconductive material is formed to eliminate the space between the shielding film 167 and the shielding dam 2120 and to electrically connect the shielding film 167 and the shielding dam 2120.

The EMI shielding structure 100b formed as described above may, for example, greatly improve the integration rate.

Referring to FIG. 33, an EMI shielding structure 100c has substantially the same structure as the EMI shielding structure 100b as described above, but a shielding layer 168 may be applied instead of the shielding film 167.

In this case, the edge bridge 166 is formed along the upper portion of the shielding dam 2120 after the insulating member 171 is formed. Then, the shielding layer 168 may be formed by injecting an insulating material into a shallow space formed on the upper surface of the insulating member 171 by the edge bridge 166.

Referring to FIG. 34, the EMI shielding structure 100d may include a shielding layer 169 by discharging the shielding material on the upper portion of the shielding dam 2120 and the upper surface of the insulating member 171 without forming the separate edge bridge 166. In this case, since the shielding layer 169 comprises a shielding material having a predetermined viscosity, the end portion of the shielding layer 169a may cover the upper portion of the shielding dam 2120 without flowing down from the upper portion of the shielding dam 2120.

As illustrated in FIGS. 32, 33 and 34, when the EMI shielding structure is formed by 3D printing without using a shield can, the manufacturing cost may be further reduced. Also, the shape of the EMI shielding structure may be more variously formed in consideration of the internal structure of the electronic device to which the EMI shielding structure is applied.

While various example embodiments of the present disclosure have been described, additional variations and modifications of the embodiments may occur to those skilled in the art in view of the present disclosure. Therefore, it is intended that the appended claims shall be understood to include both the above example embodiments and all such variations and modifications that fall within the spirit and scope of the disclosure as defined by the appended claims and their equivalents.

What is claimed is:

1. An electromagnetic interference (EMI) shielding structure comprising: a conductive material surrounding at least one circuit component mounted on a printed circuit board and grounded to a ground pad disposed on the printed circuit board; and a shield can configured to cover the at least one circuit component, wherein at least a portion of the shield can is attached the conductive material, wherein the conductive material has a predetermined elasticity,
wherein the conductive material overlaps the ground pad, and wherein a binder resin comprises silicon resin, epoxy resin, urethane resin, or alkyd resin.

2. The EMI shielding structure of claim 1, wherein a lower end portion of a side wall of the shield can is embedded in an upper portion of the conductive material.

3. The EMI shielding structure of claim 2, wherein the lower end portion of the side wall of the shield can is bent.

4. The EMI shielding structure of claim 3, wherein a width of the conductive material is greater than a width of the lower end portion of the side wall of the shield can.

5. The EMI shielding structure of claim 1, further comprising:
a shielding member comprising a shielding material at least partially covering a side wall of the shield can and an upper portion of the conductive material.

6. The EMI shielding structure of claim 5, wherein the shielding member covers the entire side wall of the shield can and at least a portion of an edge portion of a top surface of the shield can.

7. The EMI shielding structure of claim 1, further comprising:
an insulator at least partially covering a side wall of the shield can and an upper portion of the conductive material.

8. The EMI shielding structure of claim 7, wherein the insulator covers a portion of a top surface of the printed circuit board.

9. The EMI shielding structure of claim 3, wherein the lower end portion of the shield can includes at least one groove.

10. The EMI shielding structure of claim 1, wherein the ground pad is disposed on a top surface of the printed circuit board, and
the conductive material is disposed on the top surface of the printed circuit board and covers the ground pad.

11. The EMI shielding structure of claim 1, wherein the ground pad is disposed on a side surface of the printed circuit board, and
the conductive material is disposed on an end portion of the printed circuit board.

12. The EMI shielding structure of claim 11, wherein the conductive material is a shielding pad and comprises,
a first portion disposed on the side surface of the printed circuit board and covering the ground pad; and
a second portion disposed on an edge portion of a top surface of the printed circuit board.

13. The EMI shielding structure of claim 11, wherein the ground pad comprises a plurality of ground pads spaced apart from each other.

14. The EMI shielding structure of claim 1, wherein the conductive material has a predetermined viscosity.

* * * * *